(12) United States Patent
Sato et al.

(10) Patent No.: US 11,438,543 B2
(45) Date of Patent: Sep. 6, 2022

(54) SOLID-STATE IMAGING DEVICE AND ELECTRONIC APPARATUS

(71) Applicant: Sony Semiconductor Solutions Corporation, Kanagawa (JP)

(72) Inventors: Mamoru Sato, Kanagawa (JP); Akihiko Kato, Tokyo (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 37 days.

(21) Appl. No.: 17/265,899

(22) PCT Filed: Aug. 16, 2019

(86) PCT No.: PCT/JP2019/032197
§ 371 (c)(1),
(2) Date: Feb. 4, 2021

(87) PCT Pub. No.: WO2020/040066
PCT Pub. Date: Feb. 27, 2020

(65) Prior Publication Data
US 2021/0168317 A1    Jun. 3, 2021

(30) Foreign Application Priority Data

Aug. 24, 2018 (JP) .............................. JP2018-157664

(51) Int. Cl.
*H04N 5/378* (2011.01)
*H04N 5/374* (2011.01)
(Continued)

(52) U.S. Cl.
CPC ....... *H04N 5/378* (2013.01); *H01L 27/14612* (2013.01); *H01L 27/14636* (2013.01);
(Continued)

(58) Field of Classification Search
CPC ............... H04N 5/378; H04N 5/37455; H04N 5/3559; H01L 27/14636; H01L 27/14643; H01L 27/14612
See application file for complete search history.

(56) References Cited

U.S. PATENT DOCUMENTS

| 2016/0104733 A1 | 4/2016 | Sato et al. |
| 2016/0133660 A1 | 5/2016 | Inoue et al. |
| 2019/0289240 A1* | 9/2019 | Zhu ...................... H04N 5/3745 |
| 2020/0029049 A1* | 1/2020 | Okura ................ H04N 5/37455 |

(Continued)

FOREIGN PATENT DOCUMENTS

| JP | 2008-271280 A | 11/2008 |
| JP | 2016-82255 A | 5/2016 |

(Continued)

OTHER PUBLICATIONS

International Search Report (PCT/ISA/210), International Application No. PCT/JP2019/032197, dated Oct. 28, 2019.
(Continued)

*Primary Examiner* — Marly S Camargo
(74) *Attorney, Agent, or Firm* — Michael Best & Friedrich LLP

(57) ABSTRACT

A solid-state imaging device is disclosed. In one example, a solid-state imaging device includes a current mirror circuit connected to first and second vertical signal lines, first and second unit pixels connected to the first or the second vertical signal line, a current supply line connected to the first and the second unit pixels, and a constant current circuit connected to the current supply line. The unit pixels each include a photoelectric conversion element, a transfer transistor that transfers an electric charge generated in the photoelectric conversion element, first and second charge accumulation units that accumulate the transferred electric charge, a switching transistor configured to control accumu-
(Continued)

lation of the electric charge by the second charge accumulation unit, and an amplification transistor that causes a voltage corresponding to electric charges accumulated the first and/or the second charge accumulation units to appear in the first or the second vertical signal line.

20 Claims, 23 Drawing Sheets

(51) Int. Cl.
      *H04N 5/355*        (2011.01)
      *H01L 27/146*      (2006.01)
      *H04N 5/3745*      (2011.01)

(52) U.S. Cl.
      CPC ..... *H01L 27/14643* (2013.01); *H04N 5/3559* (2013.01); *H04N 5/37455* (2013.01)

(56) References Cited

U.S. PATENT DOCUMENTS

| | | | |
|---|---|---|---|
| 2020/0066773 A1* | 2/2020 | Tashiro | H01L 27/14612 |
| 2021/0281788 A1* | 9/2021 | Bogaerts | H04N 5/378 |
| 2022/0070400 A1* | 3/2022 | Shim | H04N 5/378 |

FOREIGN PATENT DOCUMENTS

| | | |
|---|---|---|
| JP | 2016-96545 A | 5/2016 |
| JP | 2018-74268 A | 5/2018 |
| WO | 2018/110303 A1 | 6/2018 |

OTHER PUBLICATIONS

Notification of Transmittal of the International Search Report and the Written Opinion of the International Searching Authority, or the Declaration (PCT/ISA/220), International Application No. PCT/JP2019/032197, dated Nov. 5, 2019.

* cited by examiner

FIG.8

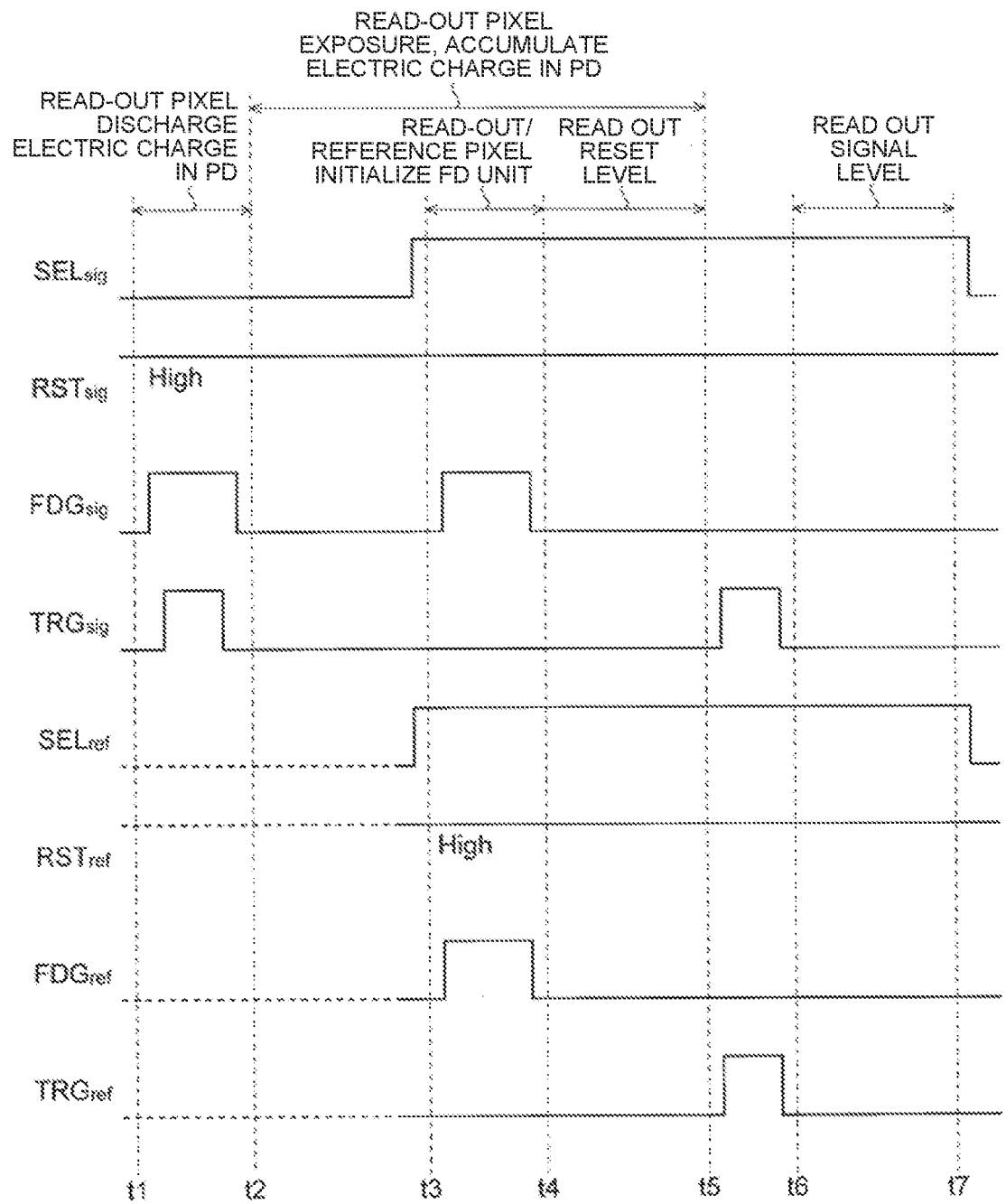

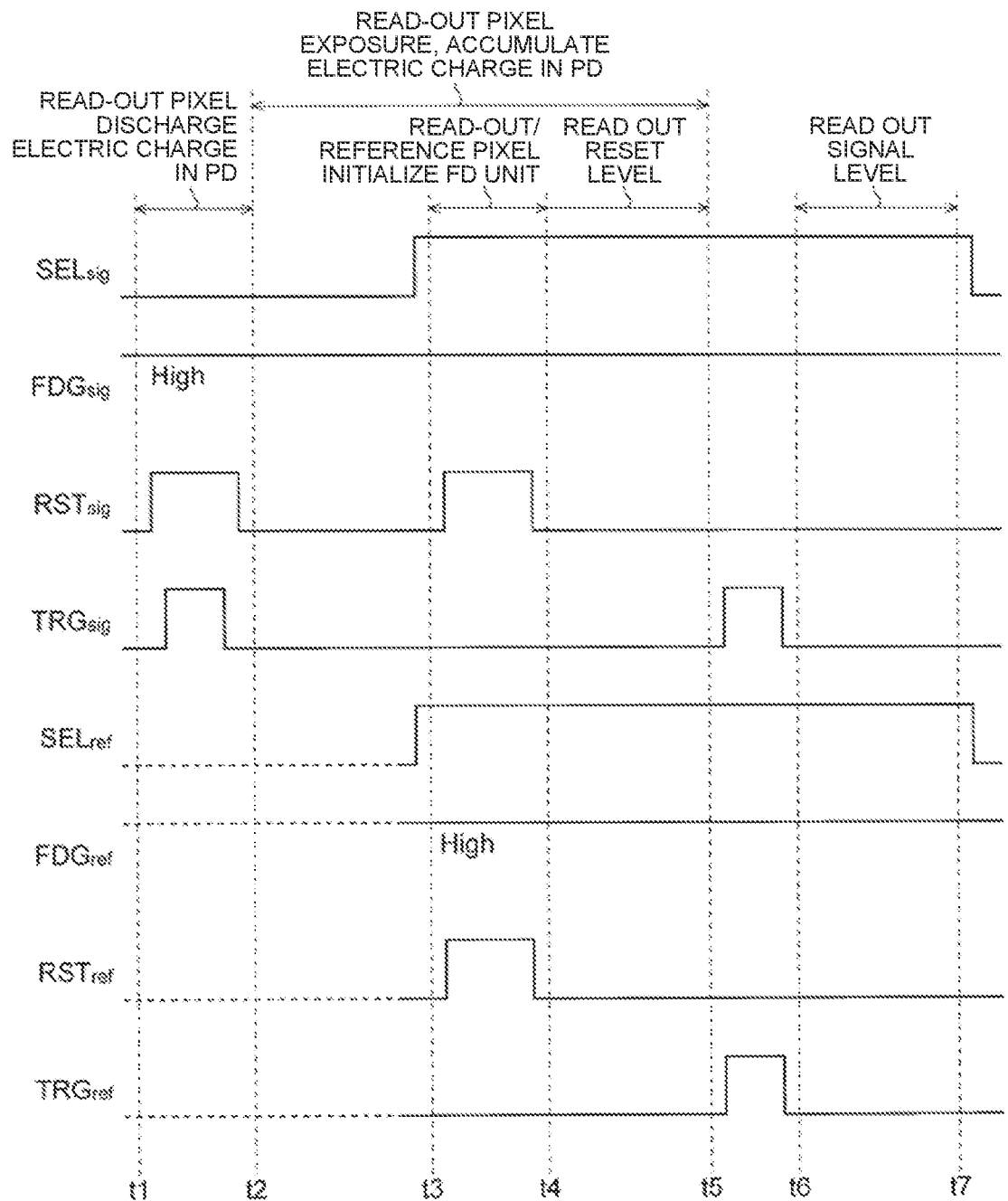

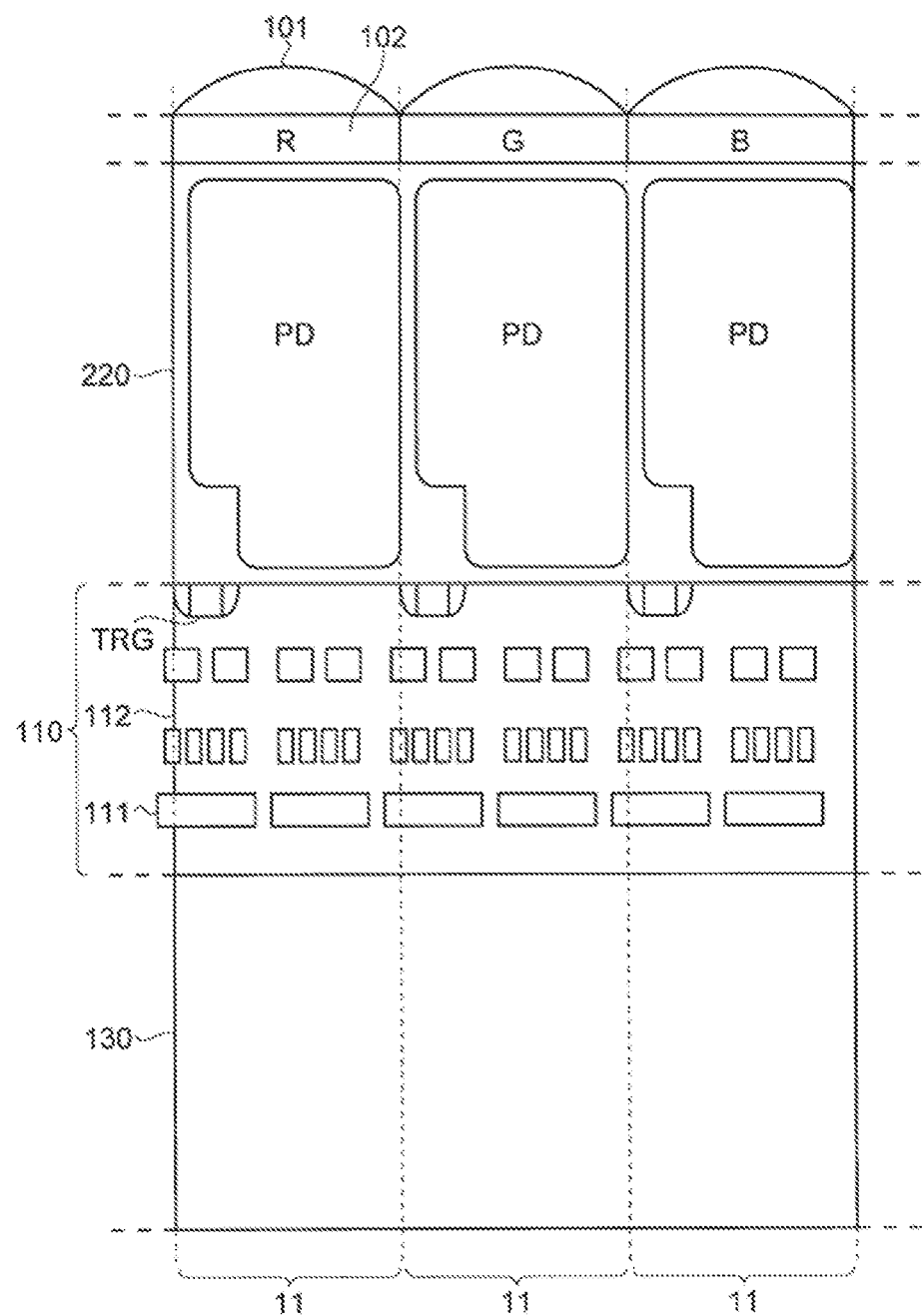

SOLID-STATE IMAGING DEVICE AND ELECTRONIC APPARATUS

FIELD

The present disclosure relates to a solid-state imaging device and an electronic apparatus.

BACKGROUND

In a complementary metal oxide semiconductor (CMOS) type of solid-state imaging device (hereinafter, referred to as a CMOS image sensor, or simply referred to as an image sensor), a signal charge generated in a photoelectron conversion unit (light receiving unit) is converted into a voltage in a floating diffusion region (floating diffusion: FD). The voltage converted in the FD is read out as an output voltage (also referred to as a pixel signal) via a source follower circuit constituted of an amplification transistor.

Assuming that signal detection capacitance is C and a signal charge amount corresponding to a light receiving signal is Q, an output voltage V of a pixel is given by V=Q/C. Thus, if the signal detection capacitance C is small, the output voltage V can be increased, that is, sensitivity can be raised.

Thus, in the related art, a high-sensitivity signal output has been implemented by configuring a pixel with a photoelectric conversion element the one end of which is grounded, a source-grounding type amplification transistor in which a gate electrode is connected to the other end of the photoelectric conversion element, a source electrode is grounded, and a drain electrode is connected to a load circuit, a capacitive element connected between the drain electrode and the gate electrode of the amplification transistor, and a reset transistor connected to the capacitive element in parallel, and reducing capacitance of the capacitive element.

CITATION LIST

Patent Literature

Patent Literature 1: Japanese Patent Application Laid-open No. 2008-271280

SUMMARY

Technical Problem

However, as pixels have been further micronized in recent years, it has become more difficult to obtain a signal voltage having a sufficient voltage value from individual pixels. When the output voltage is small, a ratio of noise components occupying the output voltage is increased, and as a result, a problem is caused such that image quality is deteriorated because an output image is affected by a noise.

Thus, the present disclosure provides a solid-state imaging device and an electronic apparatus that can suppress deterioration of the image quality.

Solution to Problem

To solve the problem described above, a solid-state imaging device according to an embodiment of the present disclosure includes a first vertical signal line and a second vertical signal line, a current mirror circuit connected to the first and the second vertical signal lines, a first unit pixel connected to the first vertical signal line, a second unit pixel connected to the second vertical signal line, a current supply line connected to the first and the second unit pixels, and a constant current circuit connected to the current supply line. Each of the first and the second unit pixels includes a photoelectric conversion element that photoelectrically converts incident light, a transfer transistor that transfers an electric charge generated in the photoelectric conversion element, first and second charge accumulation units that accumulate the electric charge transferred by the transfer transistor, a switching transistor that controls accumulation of the electric charge by the second charge accumulation unit, and an amplification transistor that causes a voltage corresponding to electric charges accumulated in the first charge accumulation unit, or the first and the second charge accumulation units, to appear in the first or the second vertical signal line. A drain of the amplification transistor of the first unit pixel is connected to the first vertical signal line, a drain of the amplification transistor of the second unit pixel is connected to the second vertical signal line, and a source of the amplification transistor of the first unit pixel and a source of the amplification transistor of the second unit pixel are connected to the current supply line.

Function

With the solid-state imaging device according to an embodiment of the present disclosure, at the time of read-out from a unit pixel constituting a differential amplifier circuit, conversion efficiency can be changed by switching total capacitance of a charge accumulation unit connected to a gate of an amplification transistor. Due to this, a maximum number of electrons that can be read out can be changed while maintaining a low noise characteristic of differential-type amplification read-out. That is, at the time of switching from source follower read-out to differential-type amplification read-out, or vice versa, read-out can be performed with intermediate conversion efficiency. As a result, source follower read-out and differential-type amplification read-out can be switched while suppressing deterioration of image quality.

BRIEF DESCRIPTION OF DRAWINGS

FIG. 8 is a circuit diagram illustrating a schematic configuration example of the differential-type amplification read-out configuration and peripheral circuits thereof according to the embodiment.

FIG. 11 is a timing chart illustrating a driving example of the differential-type amplification read-out configuration according to the embodiment.

FIG. 12 is a timing chart illustrating another driving example of the differential-type amplification read-out configuration according to the embodiment.

FIG. 22B is a cross-sectional view illustrating a cross-sectional structure example of a unit pixel according to a second example of the embodiment.

DESCRIPTION OF EMBODIMENTS

Figure 1:
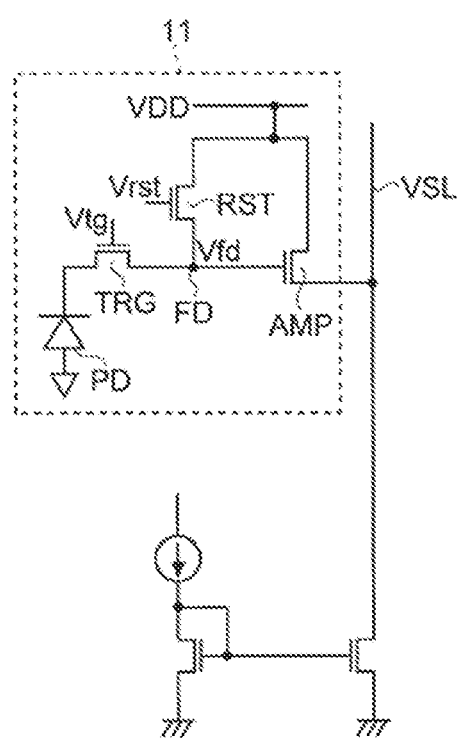
FIG. 1 is a circuit diagram illustrating a schematic configuration example of a CMOS image sensor.

The following describes an embodiment of the present disclosure in detail based on the drawings. In the following embodiment, the same part is denoted by the same reference numeral, and redundant description will not be repeated.

The present disclosure will be explained is order of items described below,
1. Introduction
2. Embodiment
   2.1 System configuration example of CMOS image sensor
   2.2 Circuit configuration example of unit pixel
   2.3 Basic function example of unit pixel
   2.4 Example of differential-type amplification read-out configuration
   2.5 Example of peripheral circuits of differential-type amplification read-out configuration
   2.6 Switch state of peripheral circuits at time of switching
      2.6.1 Switch state of peripheral circuits at time of differential-type amplification read-out
      2.6.2 Switch state of peripheral circuits at time of source follower read-out
   2.7 Driving example of differential-type amplification read-out configuration
      2.7.1 First read-out mode (RST is High at all times)
      2.7.2 Second read-out mode (FDG is High at all times)
   2.8 Conversion efficiency of differential-type amplification read-out 2.9 Driving example of source follower read-out configuration 2.10 Conversion efficiency of source follower read-out 2.11 Relation between conversion efficiency of differential-type amplification read-out and conversion efficiency of source follower read-out
   2.12 Combination example of unit pixels forming differential-type amplification read-out configuration
      2.12.1 First combination example
      2.12.2 Second combination example
         2.12.2.1 Modification of peripheral circuits of differential-type amplification read-out configuration in the case of second combination example
   2.13 Modification of circuit configuration of unit pixel
      2.13.1 First modification
      2.13.2 Second modification
      2.13.3 Third modification
      2.13.4 Fourth modification
      2.13.5 Fifth modification
      2.13.6 Sixth modification
   2.14 Cross-sectional structure example of unit pixel
      2.14.1 First example
      2.14.2 Second example
   2.15 Structure example of CMOS image sensor
      2.15.1 First example
      2.15.2 Second example
   2.16 Function and effect 1. Introduction In a typical CMOS image sensor, as illustrated in FIG. 1, a unit pixel 11 is configured by using a photodiode PD as a photoelectric conversion element, a floating diffusion region (floating diffusion) FD that converts an electron generated in the photodiode PD into a voltage, and an amplification transistor AMP using the voltage of the floating diffusion PD as a gate input. The floating diffusion region (floating diffusion) FD is also called a charge accumulation unit.

An analog output voltage (pixel signal) is read out from each unit pixel 11 via a source follower circuit constituted of the amplification transistor AMP (hereinafter, referred to as a source follower read-out configuration), and converted (Analog to Digital (AD)-converted) into a digital voltage value.

On the other hand, as a configuration of reading out the pixel signal from the unit pixel 11, there is a configuration in which a differential-type amplifier circuit (hereinafter, simply referred to as a differential amplifier circuit) is constituted of two unit pixels 11 to read out the pixel signal via the differential amplifier circuit (hereinafter, referred to as a differential-type amplification read-out configuration) in addition to the source follower read-out configuration.

The electron generated in the photodiode PD is converted into a voltage at voltage conversion efficiency ($\mu V/e^-$) per electron corresponding to parasitic capacitance of a node constituting the floating diffusion FD. A voltage amplitude $\Delta Vfd$ of the floating diffusion FD corresponding to the number of signal electrons is read out from each unit pixel 11 via the amplification transistor AMP. At this point, a noise is superimposed on the read-out pixel signal.

Examples of main generation sources of the noise include a pixel noise Vn_pix ($\mu V$ (microvolt) rms) generated by the amplification transistor AMP in the unit pixel 11, an AFE noise Vn_afe ($\mu Vrms$) generated by an analog circuit (Analog Front End: AFE) such as a circuit that amplifies a voltage that is read out from each unit pixel 11 via a vertical signal line VSL, and an ADC noise Vn_adc ($\mu Vrms$) generated by an AD conversion circuit (ADC).

Figure 2:
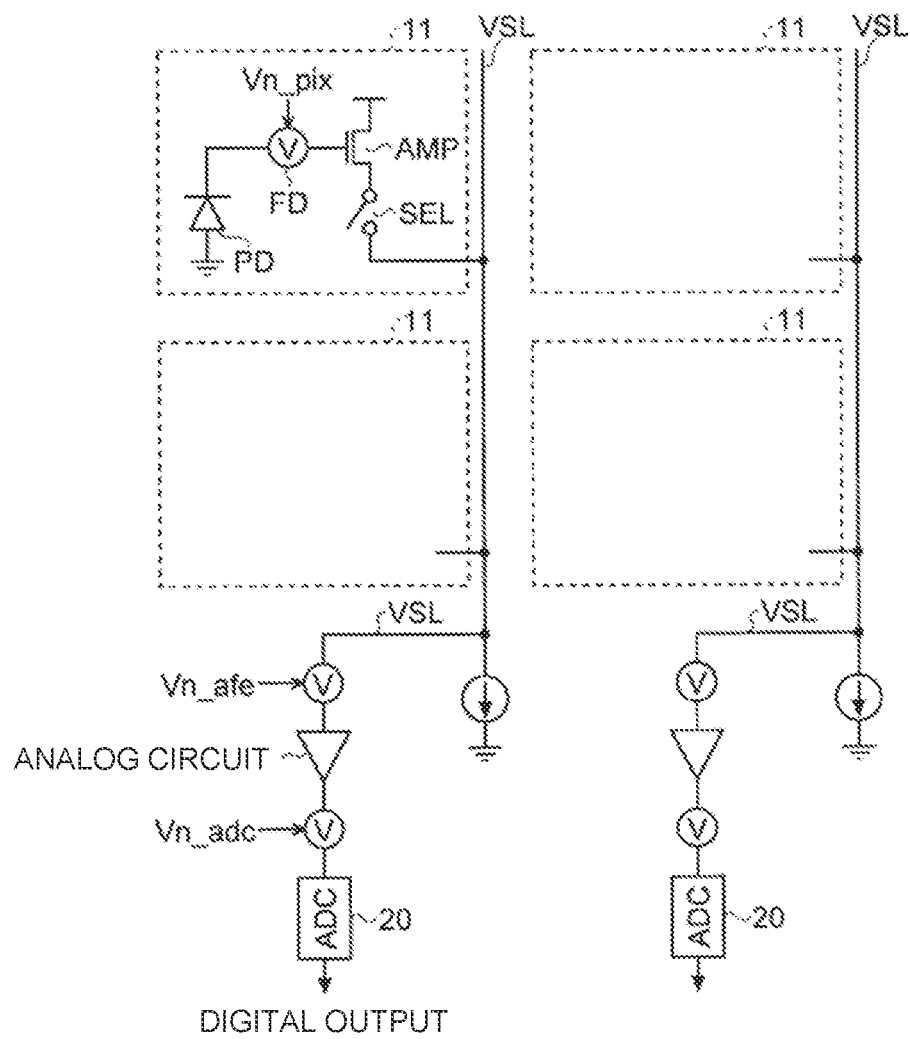
FIG. 2 is a diagram for explaining a noise generated in the CMOS image sensor.

In the following description, as illustrated in FIG. 2, a noise input-converted into a voltage noise generated in the floating diffusion FD is defined as the pixel noise Vn_pix, a noise converted into a voltage noise generated in the vertical signal line VSL is defined as the AFE noise Vn_afe, and a noise converted into a noise generated at an input node of an ADC 20 is defined as the ADC noise to Vn_adc.

In the source follower read-out configuration, gain Asf of a voltage amplitude $\Delta Vvsl$ of the vertical signal line VSL with respect to a voltage amplitude $\Delta Vfd$ of the floating diffusion FD is obtained by $\Delta Vvsl = Asf \times \Delta Vfd$, and a value thereof is about 0.8 to 1.0 times. In a case in which conversion efficiency ($\mu V/e^-$) of electron-voltage conversion in the floating diffusion FD is assumed to be $\eta fd$, that is, in a case in which conversion efficiency ($\mu V/e^-$) of electron-voltage conversion in the vertical signal line VSL is assumed to be $\eta vsl$, $\eta vsl = Asf \times \eta fd$ is satisfied.

In this case, assuming that the number of electrons of a signal read out from the photodiode PD (also referred to as a signal electron number) is Nsig_e, $\Delta Vvsl = \eta vsl \times Nsig\_e = \eta fd \times Asf \times Nsig\_e$ can be established. For simplicity, assuming that the voltage is not amplified by the AFE, that is, the gain is 1 time, when a noise superimposed on an output of the ADC 20 is converted into a voltage noise generated in the vertical signal line VSL as Vn_total ($\mu Vrms$), a total noise Vn_total is the sum of the ADC noise Vn_adc, the AFE noise Vn_afe, and a noise Afd×Vn_pix (square-arithmetic mean). This represents that the total noise Vn_total is superimposed on the voltage amplitude $\Delta Vvsl$ of the vertical signal line VSL based on the signal electron number Nsig_e. Afd is gain of the floating diffusion FD.

From the viewpoint of image quality, what amount of noise is superimposed on a certain signal electron number Nsig_e is important. When the total noise Vn_total is converted into the number of electrons in the FD 115 (unit: $e^-$rms), the number of electrons Vn_total_e of the total noise Vn_total is represented by the following expression (1).

$$Vn\_total\_e = \sqrt{(Vn\_adc/\eta vsl)^2 + (Vn\_afe/\eta vsl)^2 + (Vn\_pix/\eta fd)^2} \quad (1)$$

In the expression (1), $\eta vsl = Asf \times \eta fd$ is established, so that it can be found that influence of the ADC noise Vn_adc and the AFE noise Vn_afe can be reduced by increasing the gain Asf, and influence of the ADC noise Vn_adc, the APE noise Vn_afe, and the pixel noise Vn_pix can be reduced by increasing the conversion efficiency $\eta fd$.

As described above, the gain Asf is voltage gain of the source follower circuit, typically 0.8 to 1.0, and theoretically equal to or smaller than 1.0. Thus, it is difficult to improve the gain Asf. On the other hand, the conversion efficiency $\eta fd$ is determined based on the sum total Cfd of parasitic capacitance viewed from the floating diffusion FD, and $\eta fd = e/Cfd$ is established. e represents a quantum of electrons, and is a constant of $1.602 \times 10^{-19}$ coulomb.

Figure 3A:
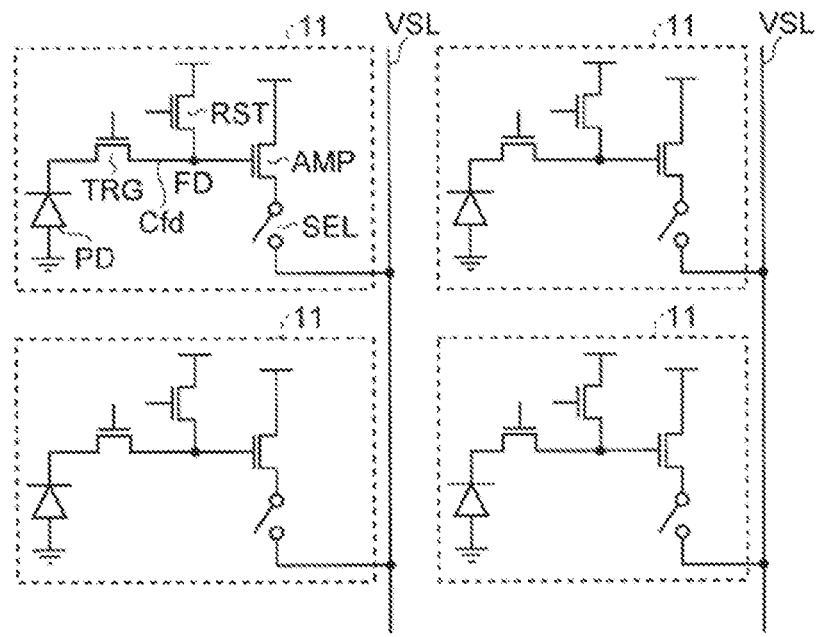
FIG. 3A is a diagram illustrating an arrangement example of unit pixels in the CMOS image sensor.
Figure 3B:
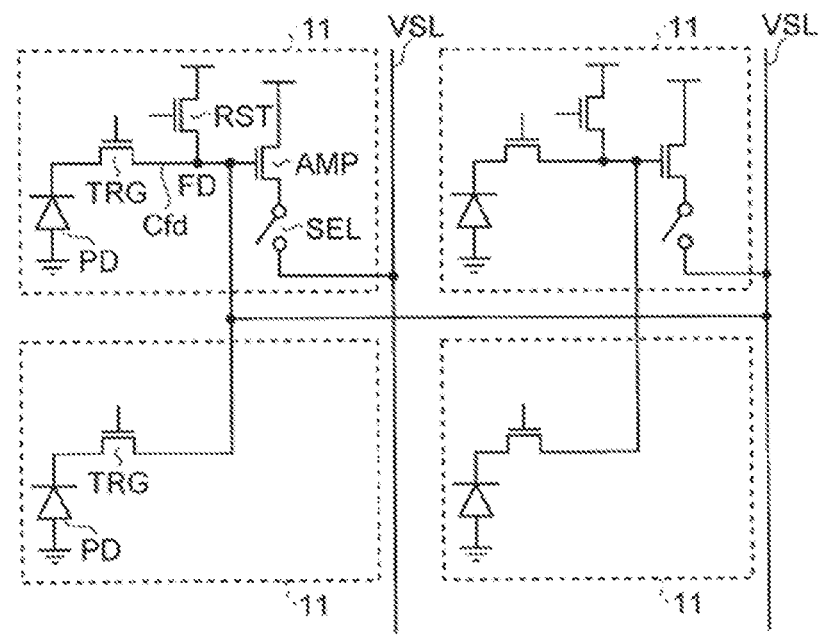
FIG. 3B is a diagram illustrating a configuration example in a case in which a plurality of unit pixels share a transistor in the CMOS image sensor.

There is a physical limit to capacitance reduction for reducing noises. As illustrated in FIG. 3A to FIG. 3B, in a case of employing a structure of sharing a transistor (for example, a reset transistor RST or the amplification transistor AMP) among a plurality of the unit pixels 11 to reduce a pitch of the unit pixels 11 (hereinafter, referred to as a pixel pitch), the parasitic capacitance Cfd of the floating diffusion FD is increased along with extension of wiring from a plurality of transfer transistors TRG to the amplification transistor AMP of sharing pixels, and it becomes more difficult to increase the conversion efficiency $\eta fd$.

As described above, the gain Asf is about 1 time in the source follower read-out configuration, so that, when the conversion efficiency $\eta fd$ cannot be increased because the unit pixel 11 is micronized, there is the problem that the conversion efficiency $\eta vsl$ cannot be designed to be large, and the noises cannot be reduced.

On the other hand, in the differential-type amplification read-out configuration, gain Adif of the voltage amplitude $\Delta Vvsl$ of the vertical signal line VSL is determined based on parasitic capacitance Cgd with respect to the vertical signal line VSL as part of the parasitic capacitance Cfd of the floating diffusion FD. The parasitic capacitance Cqd may include not only the parasitic capacitance of the amplification transistor AMP but also capacitance that is intentionally added by wiring capacitance and the like to adjust the gain Adif.

In a case in which open loop gain of the differential amplifier circuit in the differential-type amplification read-out configuration is assumed to be −Av, $\eta vsl = e/\{Cgd + Cfd/-Av\}$ is established. Similarly, when a total noise in the differential-type amplification read-out configuration is converted into the number of electrons in the floating diffusion FD, the number of electrons Vn_total_e of the total noise Vn_total is represented by the following expression (2).

$$Vn\_total\_e = \sqrt{(Vn\_adc/\eta vsl)^2 + (Vn\_afe/\eta vsl)^2 + 2 \times (Vn\_pix/\eta fd)^2} \quad (2)$$

As is clear from the expression (2), the noise can be reduced by increasing the conversion efficiency $\eta vsl$ and $\eta fd$ also in the differential-type amplification read-out configuration.

Based on a comparison between the expression (1) of the source follower read-out configuration and the expression (2) of the differential-type amplification read-out configuration, regarding the ADC noise Vn_adc and the AFE noise Vn_afe, the conversion efficiency ηvsl in the expression (1) is Asf×ηfd and the gain Asf is 1.0 at the maximum, so that ηvsl≤ηfd=e/Cfd is established. Thus, the conversion efficiency ηvsl cannot be increased in a situation in which the parasitic capacitance Cfd is difficult to be reduced.

Figure 4:
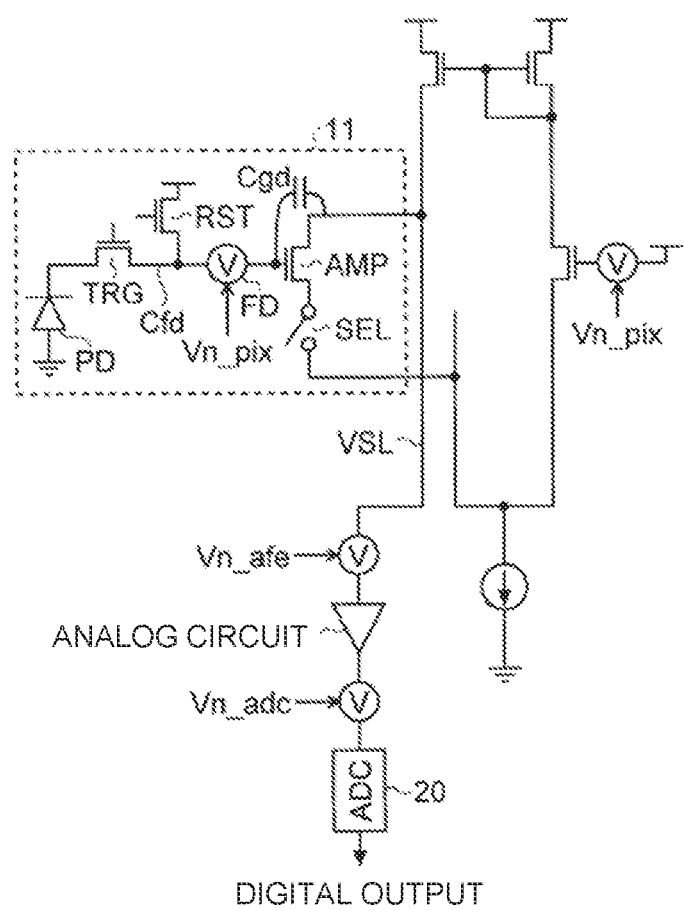
FIG. 4 is a diagram for explaining capacitance parasitic to an amplification transistor in the CMOS image sensor.

On the other hand, regarding the conversion efficiency ηvsl of the expression (2), e/{Cgd+Cfd/Av} is established and the open loop gain −Av is typically about several tens to hundreds, so that influence of the parasitic capacitance Cfd can be suppressed, and ηvsl≈e/Cgd is established accordingly. The parasitic capacitance Cgd is part of the parasitic capacitance Cfd, so that the parasitic capacitance Cgd is a smaller value than the parasitic capacitance Cfd. Additionally, as illustrated in FIG. 4, the parasitic capacitance Cgd is capacitance parasitic to the amplification transistor AMP, so that even in a case of employing a structure in which the unit pixels 11 share the amplification transistor AMP, the capacitance is not prevented from being reduced. That is, the conversion efficiency ηvsl can be a larger value in the differential-type amplification read-out configuration. This indicates that the differential-type amplification read-out configuration has an advantage over the source follower read-out configuration from the viewpoint of noise reduction.

However, conversion efficiency of the differential-type amplification read-out configuration is higher than that of the source follower read-out configuration, and a maximum number of input electrons that can be read out of the differential-type amplification read-out configuration is smaller than that of the source follower read-out configuration. That is, a dynamic range at the time of differential-type amplification read-out is small. Practically, it is preferable that source follower read-out and differential-type amplification read-out are switched in accordance with an imaging illuminance condition and the like by an auto exposure (AE) control system of an imaging device equipped with a solid-state imaging element. However, if an output signal level, a total noise, and the like of a taken image at the time of switching are largely changed, a degree of brightness or a noise of an output image varies. Accordingly, it becomes difficult to reduce deterioration of image quality in a case of incorporating a configuration for switching between source follower read-out and differential-type amplification read-out into the AE control system.

For example, it is possible to lower the conversion efficiency and widen the dynamic range by intentionally adding parasitic capacitance Cgd (parasitic capacitance between the floating diffusion FD and the vertical signal line VSL) to be closer to a characteristic of source follower read-out, but suppression rates of the AFE noise Vn_afe and the ADC noise Vn_adc are lowered as the conversion efficiency is lowered. Additionally, the pixel noise Vn_pix is inversely proportional to the total capacitance of the floating diffusion FD, so that the total noise Vn_total is deteriorated. As a result, a problem is caused such that an advantage of the differential-type amplification read-out configuration, that is, low-noise read-out in a sufficiently dark scene, is lost.

Thus, the following embodiment enables a change amount of the output signal level, the total noise, and the like of the taken image to be reduced at the time of switching between source follower read-out and differential-type amplification read-out. Due to this, it is possible to implement the solid-state imaging device and the electronic apparatus that can switch between source follower read-out and differential-type amplification read-out while suppressing deterioration of image quality.

2. Embodiment

Next, the following describes the solid-state imaging device and the electronic apparatus according to the embodiment of the present disclosure in detail with reference to the drawings.

2.1 System configuration example of CMOS Image Sensor

Figure 5:
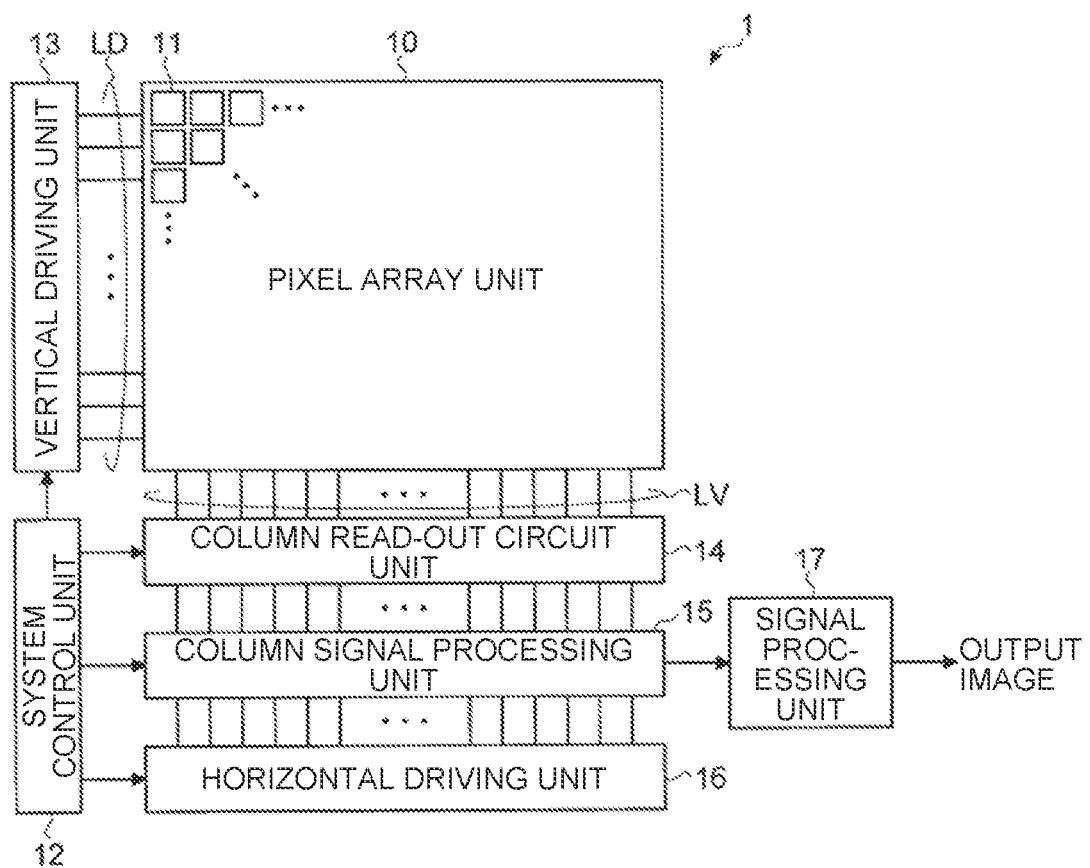
FIG. 5 is a system configuration diagram illustrating a schematic configuration example of the CMOS image sensor serving as a solid-state imaging device mounted on an electronic apparatus according to an embodiment.

FIG. 5 is a system configuration diagram illustrating a schematic configuration example of the CMOS image sensor as the solid-state imaging device mounted on the electronic apparatus according to the present embodiment. As illustrated in FIG. 5, the CMOS image sensor 1 includes a pixel array unit 10, a vertical driving unit 13, a column read-out circuit unit 14, a column signal processing unit 15, a horizontal driving unit 16, a system control unit 12, and a signal processing unit 17. The pixel array unit 10, the vertical driving unit 13, the column read-out circuit unit 14, the column signal processing unit 15, the horizontal driving unit 16, the system control unit 12, and the signal processing unit 17 are disposed on the same semiconductor substrate (chip) or a plurality of laminated semiconductor substrates (chip) that are electrically connected to each other.

In the pixel array unit 10, effective unit pixels (hereinafter, referred to as unit pixels) 11 are two-dimensionally arranged in a matrix, the unit pixel 11 including a photoelectric conversion element (photodiode PD) that can photoelectrically convert a charge amount corresponding to an incident light quantity to be accumulated therein and output as a signal. The pixel array unit 10 may include a region in which a dummy unit pixel having a structure without the photodiode PD, a light-shielding unit pixel in which light incident from the outside is shielded by shielding a light receiving surface from light, and the like are arranged in a row and/or column shape in addition to the effective unit pixel 11. The light-shielding unit pixel may have the same configuration as that of the effective unit pixel 11 except the structure in which the light receiving surface is shielded from light.

In the following description, an optical charge having a charge amount corresponding to the incident light quantity may be simply referred to as an "electric charge", and the unit pixel 11 may be simply referred to as a "pixel".

In the pixel array unit 10, a pixel driving line LD is formed for each row of the pixel array in a matrix along a horizontal direction of the drawing (an arrangement direction of the pixels in a pixel row), and vertical pixel wiring LV is formed for each column along a vertical direction of the drawing (an arrangement direction of the pixels in a pixel column). One end of the pixel driving line LD is connected to an output end of the vertical driving unit 13 corresponding to each row.

The column read-out circuit unit 14 includes at least a circuit that supplies a constant current for each column to the unit pixel 11 in a selected row within the pixel array unit 10, a current mirror circuit, a changeover switch for the unit pixel 11 to be read out, and the like, constitutes the amplifier together with the transistor of the selected pixel in the pixel array unit 10, and converts an optical charge signal into a voltage signal to be output to the vertical pixel wiring LV.

The vertical driving unit 13 includes a shift register, an address decoder, and the like, and drives the unit pixels 11 the pixel array unit 10 all at the same time, or row by row, for example. A specific configuration of the vertical driving unit 13 is not illustrated, but the vertical driving unit 13 has a configuration including a read-out scanning system, and a sweep scanning system or a batch sweep and batch transfer system.

The read-out scanning system selectively scans the unit pixels 11 of the pixel array unit 10 row by row to read out the pixel signal from the unit pixel 11. In a case of row driving (a rolling shutter operation), regarding a sweep, sweep scanning is performed on a read-out row on which read-out scanning is performed by the read-out scanning system preceding the read-out scanning corresponding to a time of shutter speed. In a case of global exposure (a global shutter operation), a batch sweep is performed preceding batch transfer corresponding to a time of shutter speed. Due to such a sweep, unnecessary electric charges are swept (reset) from the photodiode PD of the unit pixel 11 in the read-out row. Due to the sweep (reset) of the unnecessary electric charges, what is called an electronic shutter operation is performed.

In this case, the electronic shutter operation means an operation of discarding unnecessary optical charges that are accumulated in the photodiode PD immediately before the operation and newly starting exposure (starting accumulation of optical charges).

The signal that is read out through a read-out operation performed by the read-out scanning system corresponds to an amount of light that is incident after a preceding read-out operation or the electronic shutter operation. In a case of row driving, a period from a read-out timing by the preceding read-out operation or a sweep timing by the electronic shutter operation to a read-out timing by the present read-out operation becomes an accumulation time (exposure time) for the optical charge in the unit pixel 11. In a case of global exposure, a time from a batch sweep to batch transfer becomes the accumulation time (exposure time).

The pixel signal output from each of the unit pixels 11 in the pixel row that is selectively scanned by the vertical driving unit 13 is supplied to the column signal processing unit 15 through each piece of the vertical pixel wiring LV. The column signal processing unit 15 performs predetermined signal processing on the pixel signal output from each of the unit pixels 11 in the selected row via the vertical pixel wiring LV for each pixel column of the pixel array unit 10, and temporarily holds the pixel signal after the signal processing.

Specifically, the column signal processing unit 15 performs at least noise removal processing, for example, correlated double sampling (CDS) processing as the signal processing. Through the CDS performed by the column signal processing unit 15, fixed pattern noises specific to the pixel such as reset noises and threshold variations of the amplification transistor AMP are removed. The column signal processing unit 15 can also be configured to have an AD conversion function in addition to the noise removal processing, for example, and to output the pixel signal as a digital signal.

The horizontal driving unit 16 includes a shift register, an address decoder, and the like, and selects a unit circuit corresponding to the pixel column of the column signal processing unit 15 in order. Through selective scanning performed by the horizontal driving unit 16, the pixel signal on which signal processing is performed by the column signal processing unit 15 is output to the signal processing unit 17 in order.

The system control unit 12 includes a timing generator and the like that generate various timing signals, and performs driving control on the vertical driving unit 13, the column signal processing unit 15, the horizontal driving unit 16, and the like based on the various timing signals generated by the timing generator.

The CMOS image sensor 1 further includes the signal processing unit 17 and a data storage unit (not illustrated). The signal processing unit 17 has at least an addition processing function, and performs various kinds of signal processing such as addition processing on the pixel signal output from the column signal processing unit 15. In the signal processing performed by the signal processing unit 17, the data storage unit temporarily stores data required for the processing. The signal processing unit 17 and the data storage unit may be external signal processing units disposed on a substrate different from that of the CMOS image sensor 1, for example, the processing may be performed by a digital signal processor (DSP) or software, or the signal processing unit 17 and the data storage unit may be mounted on the same substrate as that of the CMOS image sensor 1.

2.2 Circuit Configuration Example of Unit Pixel

Next, the following describes a circuit configuration example of the unit pixels 11 disposed in the pixel array unit 10 in FIG. 5 in a matrix.

Figure 6:
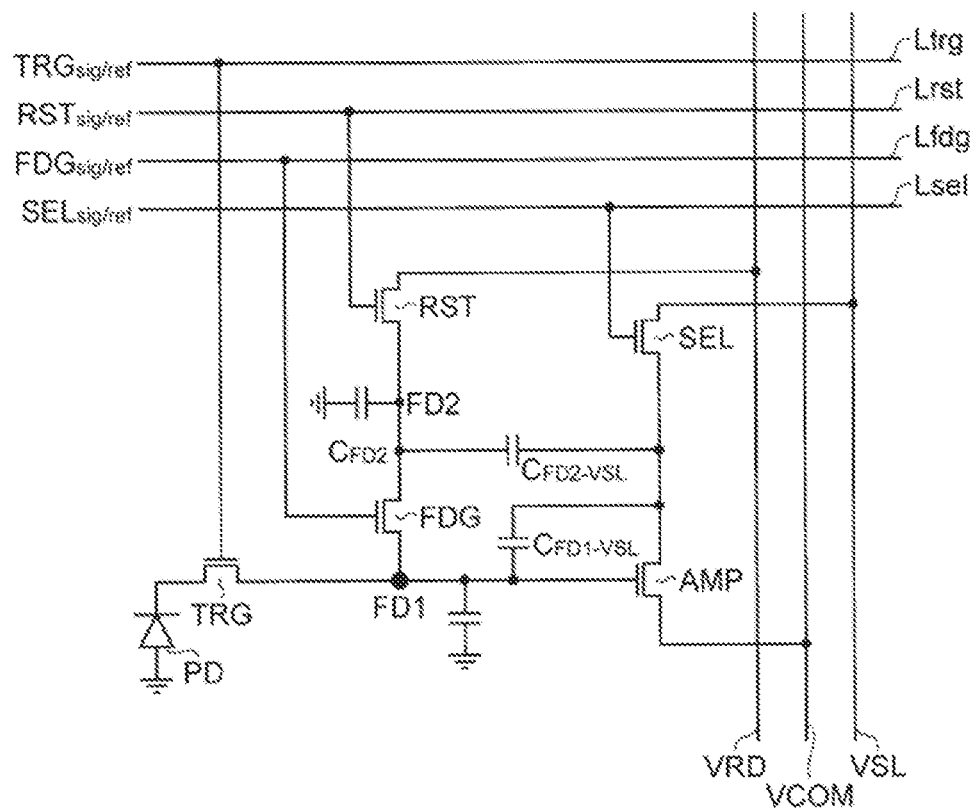
FIG. 6 is a circuit diagram illustrating a schematic configuration example of a unit pixel in an effective pixel region according to the embodiment.

FIG. 6 is a circuit diagram illustrating a schematic configuration example of the unit pixel in the effective pixel region according to the present embodiment. As illustrated in FIG. 6, the unit pixel 11 is constituted of the photodiode PD, the transfer transistor TRG, first floating diffusion FD1, the reset transistor RST, a switching transistor FDG, the amplification transistor AMP, a selection transistor SEL, a selection transistor driving line Lsel serving as the pixel driving line LD the one end of which is connected to the vertical driving unit 13, a reset transistor driving line Lrst, a switching transistor driving line Lfdg, a transfer transistor driving line Ltrg, the vertical signal line VSL serving as the vertical pixel wiring LV the one end of which is connected to the column read-out circuit unit 14, a vertical reset input line VRD, and a vertical current supply line VCOM.

The photodiode PD photoelectrically converts incident light. The transfer transistor TRG transfers an electric charge generated in the photodiode PD. The first floating diffusion FD1 and the second floating diffusion FD2 accumulate the electric charge transferred by the transfer transistor TRG. The switching transistor FDG controls accumulation of the electric charge by the second floating diffusion FD2. The amplification transistor AMP causes a pixel signal having a voltage corresponding to the electric charges accumulated in the first floating diffusion FD1 and/or the second floating diffusion FD2 to appear in the vertical signal line VSL. The reset transistor RST discharges the electric charge accumulated in the first floating diffusion FD1 and/or the second floating diffusion FD2. The selection transistor SEL selects the unit pixel 11 to be read out.

An anode of the photodiode PD is grounded, and a cathode thereof is connected to a source of the transfer transistor TRG. A drain of the transfer transistor TRG is connected to a source of the switching transistor FDG and a gate of the amplification transistor AMP, and a connection point thereof configures the first floating diffusion FD1. The reset transistor RST and the switching transistor FDG are disposed in series between the first floating diffusion FD1 and the vertical reset input line VRD.

A drain of the reset transistor RST is connected to the vertical reset input line VRD, and a source of the amplification transistor AMP is connected to the vertical current supply line VCOM. A drain of the amplification transistor AMP is connected to a source of the selection transistor SEL, and a drain of the selection transistor SEL is connected to the vertical signal line VSL.

Each of a gate of the transfer transistor TRG, a gate of the reset transistor RST, a gate of the switching transistor FDG, and a gate of the selection transistor SEL is connected to the vertical driving unit 13 via the pixel driving line LV, and a pulse as a driving signal is supplied thereto.

The gate of the amplification transistor AMP is assumed to be the first floating diffusion FD1, and a node between the switching transistor FDG and the reset transistor RST is assumed to be the second floating diffusion FD2.

Parasitic capacitance (a first capacitance component) between the first floating diffusion FD1 and grounding is assumed to be $C_{FD1}$, feedback capacitance (a second capacitance component) between a node on the drain side of the amplification transistor AMP (for example, a node between the amplification transistor AMP and the selection transistor SEL) and the first floating diffusion FD1 is assumed to be $C_{FD1\text{-}VSL}$, parasitic capacitance (a third capacitance component) between the second floating diffusion FD2 and grounding is assumed to be $C_{FD2}$, and feedback capacitance (a fourth capacitance component) between a node on the drain side of the amplification transistor AMP (for example, a node between the amplification transistor AMP and the selection transistor SEL) and the second floating diffusion FD2 is assumed to be $C_{FD2\text{-}VSL}$.

The parasitic capacitance $C_{FD1}$ and the parasitic capacitance $C_{FD2}$, and the feedback capacitance $C_{FD1\text{-}VSL}$ and the feedback capacitance $C_{FD2\text{-}VSL}$ are not limited to the parasitic capacitance and the feedback capacitance of each transistor, wiring, and the like, and may include capacitance and the like that are intentionally added, by a capacitive element, a metal layer, and the like, to a ground, a node between the amplification transistor AMP and the selection transistor SEL or the vertical signal line VSL, and the like.

2.3 Basic Function Example of Unit Pixel

Next, the following describes a basic function of the unit pixel 11. The reset transistor RST functions when the switching transistor FDG is in a High state at all times, and turns ON/OFF discharge of electric charges accumulated in the first floating diffusion FD1 and the second floating diffusion FD2 in accordance with first reset signals RSTsig/ref supplied from the vertical driving unit 13. When the first reset signals RSTsig/ref of High level are input to the gate of the reset transistor RST, the first floating diffusion FD1 and the second floating diffusion FD2 are clamped to a voltage that is applied through the vertical reset input line VRD. Due to this, the electric charges accumulated in the first floating diffusion FD1 and the second floating diffusion FD2 are discharged (reset). When the first reset signals RSTsig/ref of Low level are input to the gate of the reset transistor RST, the first floating diffusion FD1 and the second floating diffusion FD2 are electrically disconnected from the vertical reset input line VRD to be in a floating state.

The switching transistor FDG functions when second reset signals FDGsig/ref are in High state at all times, and turns ON/OFF discharge of the electric charges accumulated in the first floating diffusion FD1 in accordance with the second reset signals FDGsig/ref supplied from the vertical driving unit 13. When the second reset signals FDGsig/ref of High level are input to the gate of the switching transistor FDG, the first floating diffusion FD1 is clamped to a voltage that is applied through the vertical reset input line VRD. Due to this, the electric charges accumulated in the first floating diffusion FD1 are discharged (reset). When the second reset signals FDGsig/ref of Low level are input to the gate of the switching transistor FDG, the first floating diffusion FD1 is electrically disconnected from the vertical reset input line VRD to be in the floating state.

The photodiode PD photoelectrically converts incident light, and generates an electric charge corresponding to an amount of the light. The generated electric charge is accumulated on a cathode side of the photodiode PD. The transfer transistor TRG turns ON/OFF transfer of the electric charge from the photodiode PD to the first floating diffusion FD1 or the first floating diffusion FD1 and the second floating diffusion FD2 in accordance with a transfer control signal TRGsjg/ref supplied from the vertical driving unit 13. For example, when the transfer control signal TRGsig/ref of High level is input to the gate of the transfer transistor TRG, the electric charge accumulated in the photodiode PD is transferred to the first floating diffusion FD1 or the first floating diffusion FD1 and the second floating diffusion FD2. On the other hand, when the transfer control signal TRGsig/ref of Low level is supplied to the gate of the transfer transistor TRG, transfer of the electric charge from the photodiode PD is stopped. During a period in which the transfer transistor TRG stops transfer of the electric charge to the first floating diffusion FD1 or the first floating diffusion FD1 and the second floating diffusion FD2, the electric charge that is photoelectrically converted is accumulated in the photodiode PD.

Each of the first floating diffusion FD1 and the second floating diffusion FD2 has a function of accumulating the electric charge that is transferred from the photodiode PD via the transfer transistor TRG, and converting the electric charge into a voltage. Thus, in the floating state in which the reset transistor RST and/or the switching transistor FDG is turned OFF, respective electric potentials of the first floating diffusion FD1 and the second floating diffusion FD2 are modulated in accordance with a charge amount accumulated therein.

The amplification transistor AMP functions as an amplifier using a potential variation of the first floating diffusion FD1 or the first floating diffusion FD1 and the second floating diffusion FD2 connected to the gate thereof as an input signal, and an output voltage signal thereof is output to the vertical signal line VSL as a pixel signal via the selection transistor SEL.

The selection transistor SEL turns ON/OFF output of the voltage signal from the amplification transistor AMP to the vertical signal line VSL in accordance with a selection control signal SELsig/ref supplied from the vertical driving unit 13. For example, when the selection control signal SELsig/ref of High level is input to the gate of the selection transistor SEL, the voltage signal from the amplification transistor AMP is output to the vertical signal line VSL, and when the selection control signal SELsig/ref of Low level is input thereto, output of the voltage signal to the vertical signal line VSL is stopped. Due to this, it is possible to extract only an output of the selected unit pixel 11 in the vertical signal line VSL to which a plurality of pixels are connected.

In this way, the unit pixel 11 is driven in accordance with the transfer control signal TRGsig/ref, the first reset signal RSTsig/ref, the second reset signal FDGsig/ref, and the selection control signal SELsig/ref supplied from the vertical driving unit 13.

2.4 Example of Differential-Type Amplification Read-Out Configuration

Next, the following describes the differential-type amplification read-out configuration including the unit pixels 11 that are two-dimensionaily arranged in the pixel array unit 10 in a matrix and the column read-out circuit unit 14.

Figure 7:
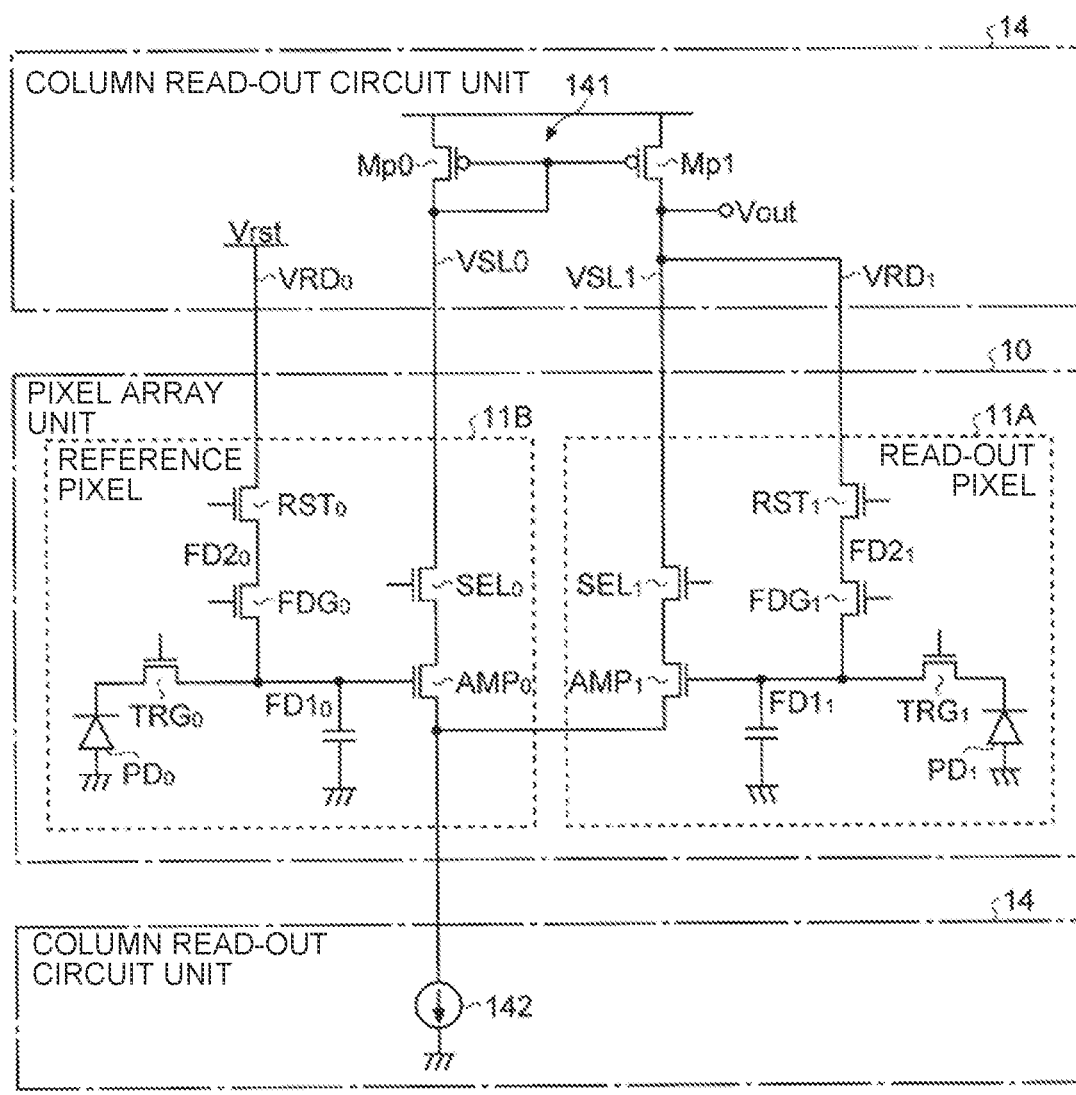
FIG. 7 is a circuit diagram illustrating a schematic configuration example of a differential-type amplification read-out configuration according to the embodiment.

FIG. 7 is a circuit diagram illustrating a schematic configuration example of the differential-type amplification read-out configuration according to the present embodiment. The differential-type amplification read-out configuration illustrated in FIG. 7 is constituted of a unit pixel (hereinafter, referred to as a signal pixel) 11A from which the pixel signal is read out, a unit pixel (hereinafter, referred to as a reference pixel) 11B that gives a reference voltage for differential amplification, a current mirror circuit 141 including PMOS transistors Mp0 and Mp1 disposed in the column read-out circuit unit 14, and a tail current source unit 142 that supplies a constant current to the signal pixel 11A and the reference pixel 11B. In this case, the reference pixel 11B is preferably the unit pixel 11 in which potential variations in the first floating diffusion $FD1_0$ at the time of reset moves equivalently to potential variations in the first floating diffusion $FD1_1$ of the signal pixel 11A, and may be an inactive effective pixel that has been read out in the vicinity of the signal pixel (also referred to as a read-out pixel) 11A to be read out, for example.

A vertical reset input line $VRD_0$ on the reference pixel 11B side is connected to a predetermined power supply Vrst in the column read-out circuit unit 14, and at the time of reset, a desired input voltage signal is applied to the first floating diffusion $FD1_0$ of the reference pixel 11B selected via the vertical reset input line $VRD_0$, that is, an input terminal of an amplification transistor $AMP_0$ on the reference pixel 11B side.

The vertical signal line VSL0 on the reference pixel 11B side is connected to a drain and a gate of the PMOS transistor Mp0 on a reference side of the current mirror circuit 141 and a gate of the PMOS transistor Mp1 on a read-out side in the column read-out circuit unit 14.

On the other hand, a vertical signal line VSL1 on the read-out side is connected to a drain of the PMOS transistor Mp1 on the read-out side of the current mirror circuit 141 and the first floating diffusion FD1 of the selected signal pixel 11A, that is, an input terminal of an amplification transistor $AMP_1$ on the read-out side via a reset transistor $RST_1$ in the column read-out circuit unit 14. Due to this, an output signal of the differential-type amplification read-out configuration is negatively fed back. The output signal of the differential-type amplification read-out configuration is extracted from the vertical signal line VSL1 as a pixel signal.

Vertical current supply lines CCOM on the reference side and the read-out side are connected to each other, and thereafter connected to the tail current source unit 142 as a constant current source configured by using a load MOS transistor such as an NMOS transistor, for example.

Figure 8:
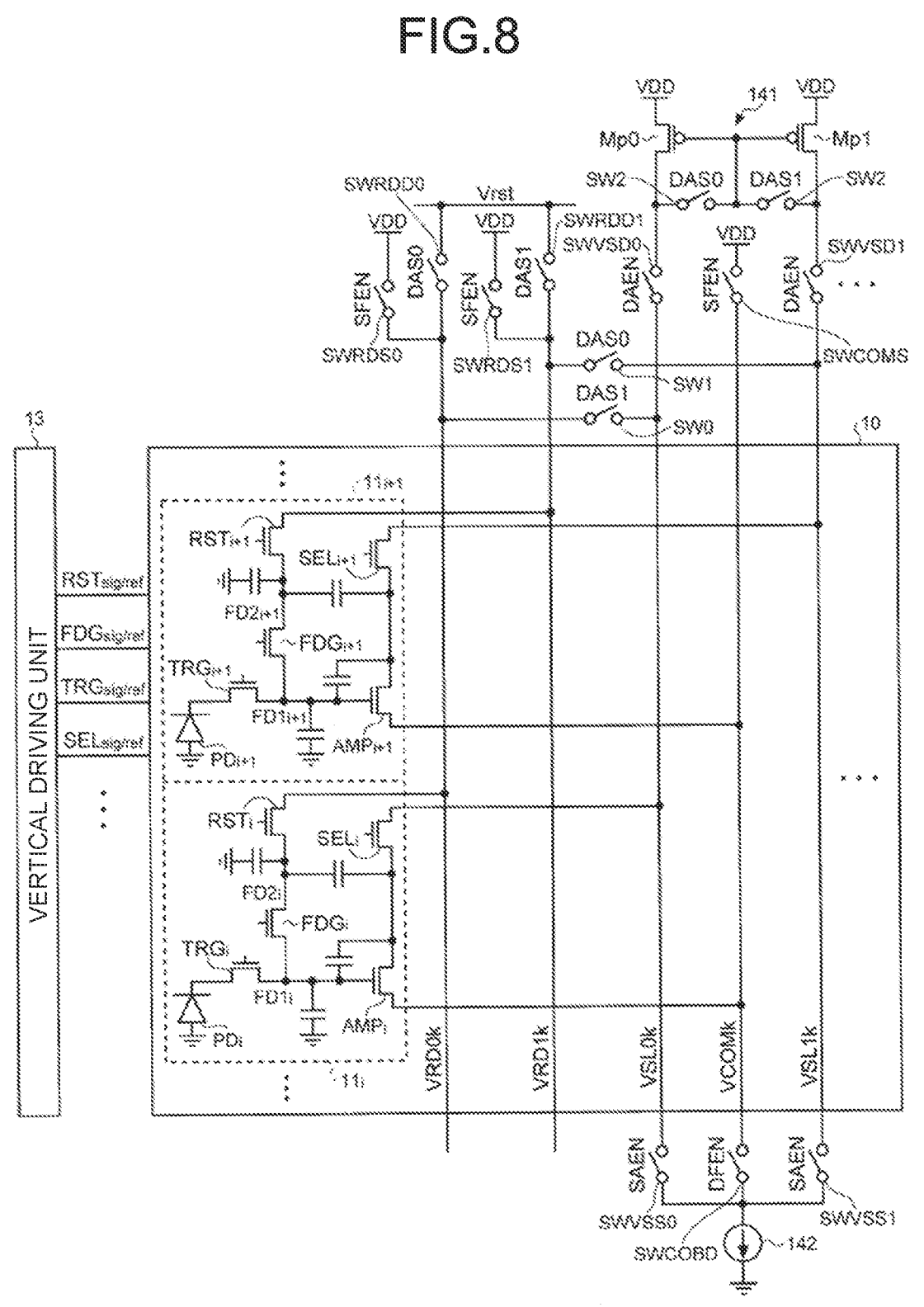

2.5 Example of Peripheral Circuit of Differential-Type Amplification Read-Out Configuration Subsequently, the following describes a configuration of the differential-type amplification read-out configuration including a peripheral circuit. FIG. 8 is a circuit diagram illustrating a schematic configuration example of the differential-type amplification read-out configuration and a peripheral circuit thereof according to the present embodiment. The differential-type amplification read-out configuration in FIG. 8 is similar to the differential-type amplification read-out configuration exemplified in FIG. 7. However, in FIG. 8, the reference pixel 11B in FIG. 7 is assumed to be a unit pixel $11_i$, and the signal pixel 11A is assumed to be a unit pixel $11_{i+1}$, by way of example.

As illustrated in FIG. 8, as the signal pixel 11A and the reference pixel 11B forming the differential-type amplification read-out configuration, for example, used are the two unit pixels $11_i$ and $11_{i+1}$ among the unit pixels 11 arranged in a column direction. That is, the differential amplifier circuit as the differential-type amplification read-out con-figuration is constituted of the tail current source unit 142 serving as the constant current circuit, the current mirror circuit 141, and the amplification transistors $AMP_i$ and $AMP_{i+1}$ of the respective two unit pixels 11.

A source of a reset transistor $RST_i$ of the unit pixel $11_i$ is connected to a vertical reset input line $VRD0_k$. On the other hand, a source of a reset transistor $RST_{i+1}$ of the unit pixel $11_{i+1}$ is connected to a vertical reset input line $VRD1_k$.

A source of a selection transistor $SEL_i$ of the unit pixel $11_i$ is connected to a vertical signal line $VSL0_k$. On the other hand, a source of a selection transistor $SEL_{i+1}$ of the unit pixel $11_{i+1}$ is connected to a vertical signal line $VSL1_k$.

Additionally, a source of the amplification transistor $AMP_i$ of the unit pixel $11_i$ and a source of the amplification transistor $AMP_{i+1}$ of the unit pixel $11_{i+1}$ are both connected to a vertical current supply line $VCOM_k$.

The vertical reset input line $VRD0_k$ is connected to a power supply voltage VDD via a switch SWRDS0 to which an enable signal SFEN of High level is input at the time of source follower read-out, and connected to a predetermined power supply Vrst via a switch SWRDD0 to which an enable signal DAEN of High level is input at the time of differential-type amplification read-out. Similarly, the vertical reset input line $VRD1_k$ is connected to the power supply voltage VDD via a switch SWRDS1 to which the enable signal SFEN of High level is input at the time of source follower read-out, and connected to the predetermined power supply Vrst via a switch SWRDD1 to which the enable signal DAEN of High level is input at the time of differential-type amplification read-out.

One end of the vertical signal line $VSL0_k$ is connected to the current mirror circuit 141 via a switch SWVSD0 to which the enable signal DAEN of High level is input at the time of differential-type amplification read-out, and the other end thereof is connected to the tail current source unit 142 via a switch SWVSS0 to which the enable signal SFEN of High level is input at the time of source follower read-out. Similarly, one end of the vertical signal line $VSL1_k$ is connected to the current mirror circuit 141 via a switch SWVSD1 to which the enable signal DAEN of High level is input at the time of differential-type amplification read-out, and the other end thereof is connected to the tail current source unit 142 via a switch SWVSS1 to which the enable signal SFEN of High level is input at the time of source follower read-out.

One end of the vertical current supply line $VCOM_k$ is connected to the power supply voltage VDD via a switch SWCOMS to which the enable signal SFEN of High level is input at the time of source follower read-out, and the other end thereof is connected to the tail current source unit 142 via a switch SWCOMD to which the enable signal DAEN of High level is input at the time of differential-type amplification read-out.

The vertical reset input line $VRD0_k$ and the vertical signal line $VSL0_k$ are connected to each other via a switch SW0 to which a control signal DAS0 for controlling switching of signal pixels in the column direction is input. Similarly, the vertical reset input line $VRD1_k$ and the vertical signal line $VSL1_k$ are connected to each other via a switch SW1 to which a control signal DAS1 for controlling switching of signal pixels in the column direction is input.

Additionally, a drain of the PMOS transistor Mp0 disposed in the vertical signal line $VSL0_k$ in the current mirror circuit 141 is connected to gates of the PMOS transistors Mp0 and Mp1 via a switch SW2 to which the control signal DAS0 for controlling switching of signal pixels in the column direction is input. Similarly, a drain of the PMOS transistor Mp1 disposed in the vertical signal line VSL1$_k$ in the current mirror circuit 141 is connected to the gates of the PMOS transistors Mp0 and Mp1 via a switch SW3 to which the control signal DAS1 for controlling switching of signal pixels in the column direction is input.

In the configuration as described above, differential-type amplification read-out and source follower read-out can be switched by switching ON/OFF of the respective switches SW. At the time of differential-type amplification read-out, the conversion efficiency of the differential-type amplification read-out configuration can be changed by switching ON/OFF of the switching transistors FDG$_i$ and FDG$_{i+1}$.

The combination of the signal pixel 11A and the reference pixel 11B is not limited to the two unit pixels 11$_i$ and 11$_{i+1}$ that are adjacent to each other in the column direction. However, as illustrated in FIG. 8, for example, in a case in which the selection transistor SEL$_i$ of the unit pixel 11$_i$ in an odd-numbered row is connected to the vertical signal line VSL0$_k$, and the selection transistor SEL$_{i+1}$ of the unit pixel 11$_{i+1}$ in an even-numbered row is connected to the vertical signal line VSL1$_k$, the two adjacent unit pixels 11$_i$ and 11$_{i+1}$ can be combined with each other as the signal pixel 11A and the reference pixel 11B. However, the embodiment is not limited thereto. The combination of the two unit pixels 11 in the same column can be variously modified so long as the respective selection transistors SEL are connected to different vertical signal lines VSL.

2.6 Switch State of Peripheral Circuits at Time of Switching

Next, the following describes a switch state of peripheral circuits at the time of switching between differential-type amplification read-out and source follower read-out based on the configuration example illustrated in FIG. 8.

Figure 9:
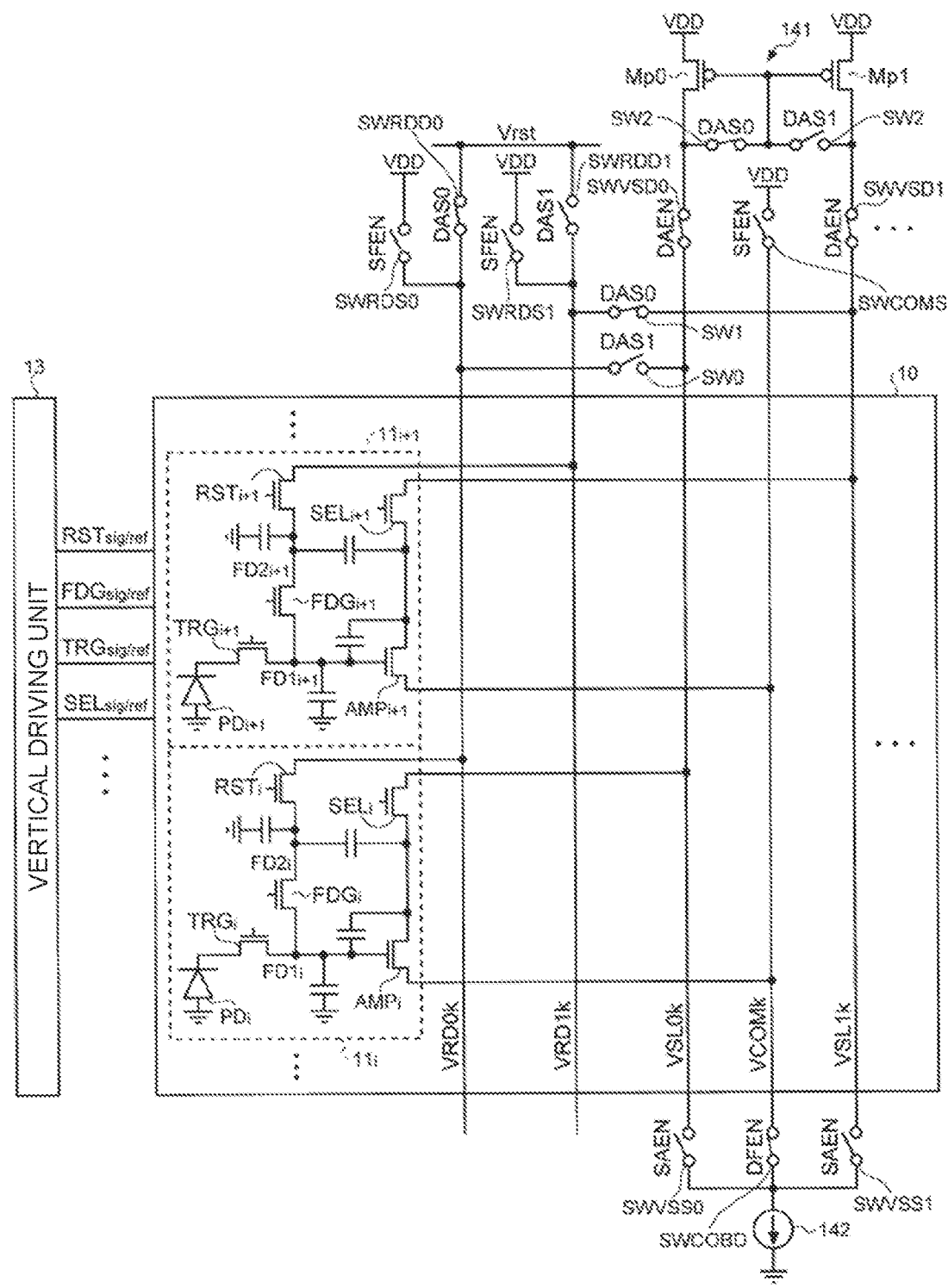
FIG. 9 is a circuit diagram illustrating an example of a switch state of the peripheral circuits at the time of differential-type amplification read-out according to the embodiment.

2.6.1 Switch State of Peripheral Circuits at Time of Differential Type Amplification Read-Out FIG. 9 is a circuit diagram illustrating an example of the switch state of the peripheral circuits at the time of differential-type amplification read-out according to the present embodiment based on the configuration example illustrated in FIG. 8.

As illustrated in FIG. 9, at the time of differential-type amplification read-out, the switches SWRDS0, SWRDS1, SWCOMS, SWVSS0, and SWVSS1 in the peripheral circuits are caused to be in the OFF state when the enable signal SFEN of Low level is output, and the switches SWVSD0, SWVSD1, and SWCOMD in the peripheral circuits are caused to be in the ON state when the enable signal DAEN of High level is output.

In a case in which the unit pixel 11$_i$ in the i-th row is selected as the reference pixel 11B, and the unit pixel 11$_{i+1}$ in the (i+1)-th row is selected as the signal pixel 11A, a control signal DAS0 of High level and a control signal DAS1 of Low level are output. Due to this, the switches SWRDD0, SW0, and SW2 in the peripheral circuits are caused to be in the ON state, and the switches SWRDD1, SW1, and SW3 are caused to be in the OFF state.

Although not illustrated, in a case of selecting the unit pixel 11$_{i-1}$ in the (i−1)-th row as the reference pixel 11B and selecting the unit pixel 11$_i$ in the i-th row as the signal pixel 11A, the control signal DAS0 of Low level and the control signal DAS1 of High level are output to cause the switches SWRDD0, SW0, and SW2 in the peripheral circuits to be in the OFF state and cause the switches SWRDD1, SW1, and SW3 to be in the ON state.

2.6.2 Switch State of Peripheral Circuits at Time of Source Follower Read-Out

Figure 10:
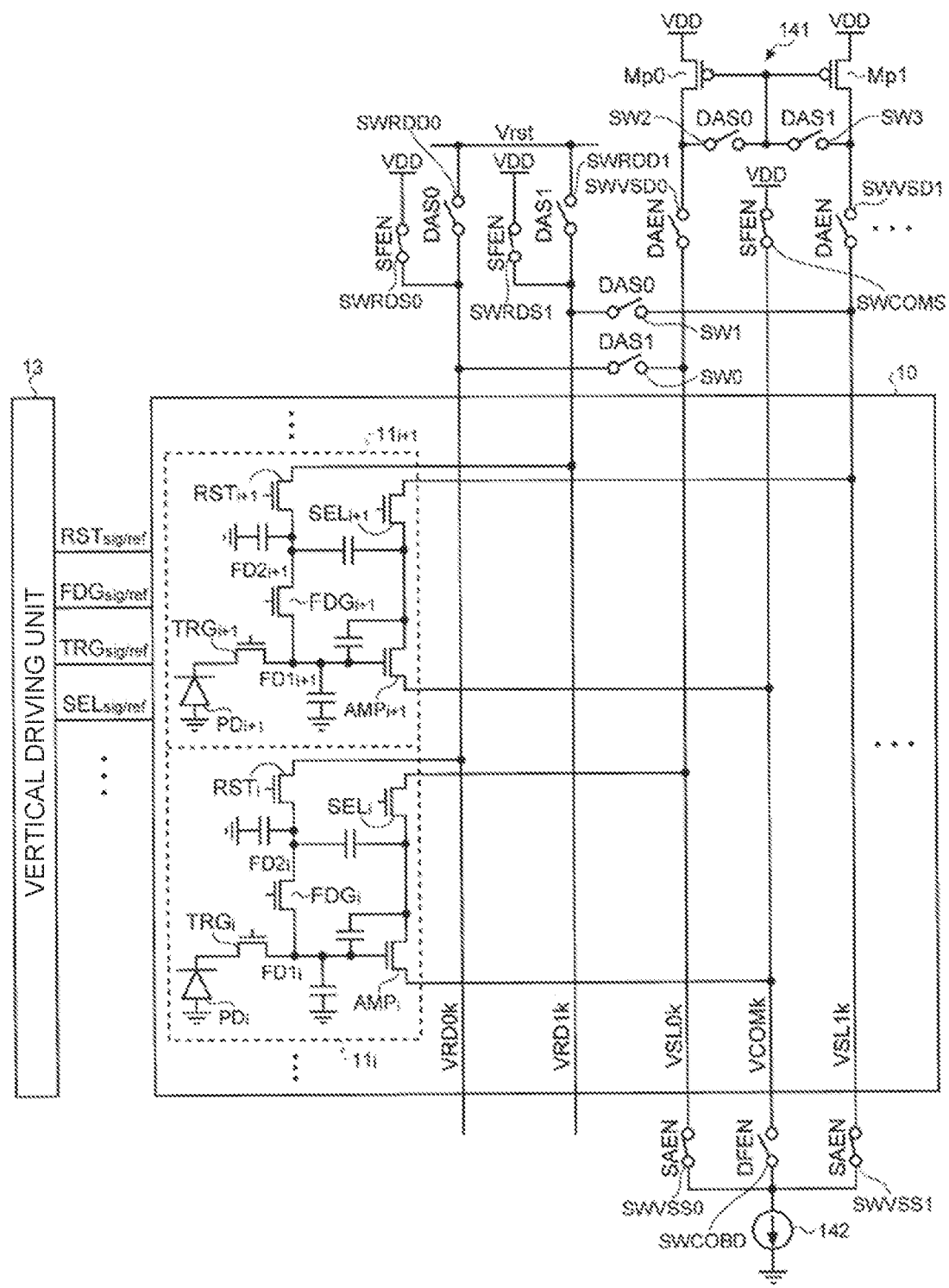
FIG. 10 is a circuit diagram illustrating an example of a switch state of the peripheral circuits at the time of source follower read-out according to the embodiment.

On the other hand, FIG. 10 is a circuit diagram illustrating an example of a switch state of the peripheral circuits at the time of source follower read-out according to the present embodiment based on the configuration example illustrated in FIG. 8.

As illustrated in FIG. 10, at the time of source follower read-out, the switches SWRDS0, SWRDS1, SFCOMS, SWVSS0, and SWVSS1 the peripheral circuits are caused to be in the ON state when the enable signal SFEN of High level is output, and the switches SWVSD0, SWVSD1, and SWCOMD in the peripheral circuits are caused to be in the OFF state when the enable signal DAEN of Low level is output.

The control signals DAS0 and DAS1 are caused to be at Low level at all times. Thus, at the time of source follower read-out, the switches SWRDD0, SW0, and SW2, and the switches SWRDD1, SW1, and SW3 in the peripheral circuits are caused to be in the OFF state at all times.

As described above, by controlling the switches SW disposed in the peripheral circuits, differential-type amplification read-out and source follower read-out can be switched.

2.7 Driving Example of Differential-Type Amplification Read-Out Configuration

Next, the following describes a driving example of the differential-type amplification read-out configuration. For clarification, the following description is based on the differential-type amplification read-out configuration illustrated in FIG. 7.

2.7.1 First Read-Out Mode (RST is High at All Times)

FIG. 11 is a timing chart illustrating a driving example of the differential-type amplification read-out configuration according to the present embodiment. The present example describes a read-out mode (hereinafter, referred to as a first read-out mode) in which the first reset signals RSTsig/ref are caused to be in High state at all times. This first read-out mode is a read-out mode using the first floating diffusion FD1 as a transfer destination of the electric charge accumulated in the photodiode PD.

As illustrated in FIG. 11, in the first read-out mode, first, when the second reset signal FDGsig and the transfer control signal TRGsig input to the signal pixel 11A rise to High level in a period from a time t1 to a time t2, the electric charges accumulated in the photodiode PD$_1$ and the first floating diffusion FD1 of the signal pixel 11A are discharged via the switching transistor FDG$_1$. Due to this, the electric charges that have been accumulated in the photodiode PD$_1$ are swept, and electric charges that are obtained by photoelectrically converting new incident light are accumulated in the photodiode PD$_1$ in a period from the time t2 to a time t5.

Next, when selection control signals SELsig and SELref of the selected signal pixel 11A and reference pixel 11B rise from Low level to High level in a period from a time t3 to a time t7, a current is supplied from the tail current source unit 142 in a direction from respective sources of the amplification transistor AMP$_1$ of the signal pixel 11A and the amplification transistor AMP$_0$ of the reference pixel 11B to respective drains thereof. Due to this, the differential amplifier circuit (differential-type amplification read-out configuration) using the electric potential of the first floating diffusion FD1$_1$ of the signal pixel 11A as an input voltage signal operates, and as a result, an amplified voltage signal is output to the vertical signal line VSL. This state continues until the selection control signals SELsig and SELref become at Low level at the time t7.

In the period from the time t1 to the time t3, each of driving signals SELref, RSTref, FDGref, and TRGref of the reference pixel 11B does not contribute to signal read-out of the signal pixel 11A.

When the second reset signal FDGsig input to the signal pixel 11A and the second reset signal FDGref input to the reference pixel 11B rise to High level in a period from the time t3 to a time t4, the electric charges accumulated in the first floating diffusion $FD1_1$ and the first floating diffusion $FD1_0$ of the signal pixel 11A and the reference pixel 11B are discharged, and an output signal level is initialized (reset) accordingly.

At this point, an output Vout of the differential amplifier circuit is electrically connected to the first floating diffusion $FD1_1$ of the signal pixel 11A as one of inputs of the differential amplifier circuit via the vertical reset input line $VRD_1$ and the switching transistor $FDG_1$ on the signal pixel 11A side. As a result, the output Vout of the differential amplifier circuit is negatively fed back to the first floating diffusion $FD1_1$ of the signal pixel 11A to be in a virtual grounded state, so that the first floating diffusion $FD1_0$ of the reference pixel 11B that is externally applied to be fixed to a predetermined power supply Vrst, the first floating diffusion $FD1_1$ of the signal pixel 11A, and the output Vout have the same electric potential (a configuration of a voltage follower circuit).

Next, when the second reset signal FDGsig input to the signal pixel 11A and the second reset signal FDGref input to the reference pixel 11B fall from High level to Low level, the first floating diffusion $FD1_1$ and the first floating diffusion $FD1_0$ of the signal pixel 11A and the reference pixel 11B are electrically disconnected from the respective vertical reset input lines $VRD_1$ and $VRD_0$ to be in a floating state.

At this point, the structures of the first floating diffusion $FD1_1$ of the signal pixel 11A and the first floating diffusion $FD1_0$ of the reference pixel 11B are substantially equivalent to each other, so that potential variations at the time of reset-OFF (reset feedthrough) become substantially the same, and the electric potential of the first floating diffusion $FD1_1$ of the signal pixel 11A and the electric potential of the first floating diffusion $FD1_0$ of the reference pixel 11B move in substantially the same way. Thus, the output of the differential amplifier circuit is hardly changed from a voltage level of the power supply Vrst at the time of reset-ON. This state is a reset (initial) state in differential-type amplification read-out, and this output level is a reset (initial) level in differential-type amplification read-out. This is because in-phase signal components of both inputs of the differential amplifier circuit are not amplified. This reset state continues until a signal charge is transferred at the time t5 while a voltage as a reset level is read out.

Next, when the transfer control signal TRGsig of the signal pixel 11A rises to High level in a pulse form in a period from the time t5 to the time t6, the electric charge accumulated in the photodiode $PD_1$ of the signal pixel 11A is transferred to the first floating diffusion FD1 via the transfer transistor $TRG_1$. The electric potential of the first floating diffusion FD1 of the signal pixel 11A is modulated by the transferred electric charge. When the modulated electric potential is input to a gate of the amplification transistor $AMP_1$ of the signal pixel 11A as a voltage signal, a voltage signal corresponding to an accumulated charge amount is output to the vertical signal line VSL1 on the signal pixel 11A side.

This signal read-out state continues until the selection control signals SELsig and SELref become at Low level at the time t7 while a voltage as a signal level is read out.

By taking a difference between the reset level and the signal level that are read out as previously described, CDS processing for removing noises is performed, and the pixel signal from which the noises are removed is read out accordingly.

2.7.2 Second Read-Out Mode (FDG is High at All Times)

Next, the following describes another driving example of the differential-type amplification read-out configuration. FIG. 12 is a timing chart illustrating another driving example of the differential-type amplification read-out configuration according to the present embodiment. The present example describes a read-out mode (hereinafter, referred to as a second read-out mode) in which the second reset signals FDGsig/ref are caused to be in High state at all times. This second read-out mode is a read-out mode using the first floating diffusion FD1 and second floating diffusion DS2 as transfer destinations of the electric charge accumulated in the photodiode PD. Thus, a third read-out mode is a read-out mode the conversion efficiency ηvsl of which is lower than that of the first read-out mode.

As illustrated in FIG. 12, in the second read-out mode, first, when the first reset signal RSTsig and the transfer control signal TRGsig input to the signal pixel 11A rise to High level in a period from the time t1 to the time t2, the electric charges accumulated in the photodiode $PD_1$ of the signal pixel 11A, the first floating diffusion $FD1_1$, and second floating diffusion $FD2_1$ are discharged via the reset transistor $RST_1$. Due to this, the electric charges that have been accumulated in the photodiode $PD_1$ are swept, and electric charges that are obtained by photoelectrically converting new incident light are accumulated in the photodiode $PD_1$ in a period from the time t2 to the time t5.

Next, when the selection control signals SELsig and SELref of the selected signal pixel 11A and reference pixel 11B rise from Low level to High level in a period from the time t3 to the time t7, a current is supplied from the tail current source unit 142 in a direction from the respective sources of the amplification transistor $AMP_1$ of the signal pixel 11A and the amplification transistor $AMP_0$ of the reference pixel 11B to the respective drains thereof. Due to this, the differential amplifier circuit (differential-type amplification read-out configuration) using a synthesized potential of the first floating diffusion $FD1_1$ and the second floating diffusion $FD2_1$ of the signal pixel 11A as an input voltage signal operates, and as a result, an amplified voltage signal is output to the vertical signal line VSL. This state continues until the selection control signals SELsig and SELref become at Low level at the time t7.

In the period from the time t1 to the time t3, each of the driving signals SELref, RSTref, FDGref, and TRGref of the reference pixel 11B does not contribute to signal read-out of the signal pixel 11A.

When the first reset signal RSTsig input to the signal pixel 11A and the first reset signal RSTref input to the reference pixel 11B rise to High level in a period from the time t3 to the time t4, the electric charges accumulated in the first floating diffusion $FD1_1$, the second floating diffusion $FD2_1$, the first floating diffusion $FD1_0$, and the second floating diffusion $FD2_0$ of the signal pixel 11A and the reference pixel 11B are discharged, and the output signal level is initialized (reset) accordingly.

At this point, the output Vout of the differential amplifier circuit is electrically connected to the first floating diffusion FD1 and the second floating diffusion FD2 of the signal pixel 11A as one of inputs of the differential amplifier circuit via the vertical reset input line $VRD_1$ and the reset transistor $RST_1$ on the signal pixel 11A side. As a result, the output Vout of the differential amplifier circuit is negatively fed back to the first floating diffusion $FD1_1$ and the second floating diffusion $FD2_1$ of the signal pixel 11A to be in the virtual grounded state, so that the first floating diffusion $FD1_0$ and the second floating diffusion $FD2_0$ of the reference pixel 11B externally applied to be fixed to the predetermined power supply Vrst, the first floating diffusion $FD1_1$ and the second floating diffusion $FD2_1$ of the signal pixel 11A, and the output Vout have the same electric potential (configuration of the voltage follower circuit).

Next, when the second reset signal FDGsig input to the signal pixel 11A and the second reset signal FDGref input to the reference pixel 11B fall from High level to Low level, the first floating diffusion $FD1_1$ and the first floating diffusion $FD1_0$, and the second floating diffusion $FD2_1$ and the second floating diffusion $FD2_0$ of the signal pixel 11A and the reference pixel 11B are electrically disconnected from the respective vertical reset input lines $VRD_1$ and $VRD_0$ to be in the floating state.

At this point, the structures of the first floating diffusion $FD1_1$ and the second floating diffusion $FD2_1$ of the signal pixel 11A, and the first floating diffusion. $FD1_0$ and the second floating diffusion $FD2_0$ of the reference pixel 11B are substantially equivalent to each other, so that potential variations at the time of reset-OFF (reset feedthrough) become substantially the same, and electric potentials of the first floating diffusion $FD1_1$ and the second floating diffusion $FD2_1$ of the signal pixel 11A and electric potentials of the first floating diffusion $FD1_0$ and the second floating diffusion $FD2_0$ of the reference pixel 11B move in substantially the same way. Thus, the output of the differential amplifier circuit is hardly changed from the voltage level of the power supply Vrst at the time of reset-ON. This state is a reset (initial) state in differential-type amplification read-out, and this output level is a reset (initial) level in differential-type amplification read-out. This is because in-phase signal components of both inputs of the differential amplifier circuit are not amplified. This reset state continues until a signal charge is transferred at the time t5 while a voltage as a reset level is read out.

Next, when the transfer control signal TRGsig of the signal pixel 11A rises to High level in a pulse form in a period from the time t5 to the time t6, the electric charges accumulated in the photodiode $PD_1$ of the signal pixel 11A are transferred to the first floating diffusion $FD1_1$ and the second floating diffusion $FD2_1$ via the transfer transistor $TRG_1$. The electric potentials of the first floating diffusion $FD1_1$ and the second floating diffusion $FD2_1$ of the signal pixel 11A are modulated by the transferred electric charges. When the modulated electric potentials are input to the gate of the amplification transistor $AMP_1$ of the signal pixel 11A as a voltage signal, a voltage signal corresponding to the accumulated charge amount is output to the vertical signal line VSL1 on the signal pixel 11A side.

This signal read-out state continues until the selection control signal SELsig becomes at Low level at the time t7 while a voltage as a signal level is read out.

By taking a difference between the reset level and the signal level that are read out as previously described, CDS processing for removing noises is performed, and the pixel signal from which the noises are removed is read out accordingly.

2.8 Conversion Efficiency of Differential-Type Amplification Read-Out

Figure 13A:
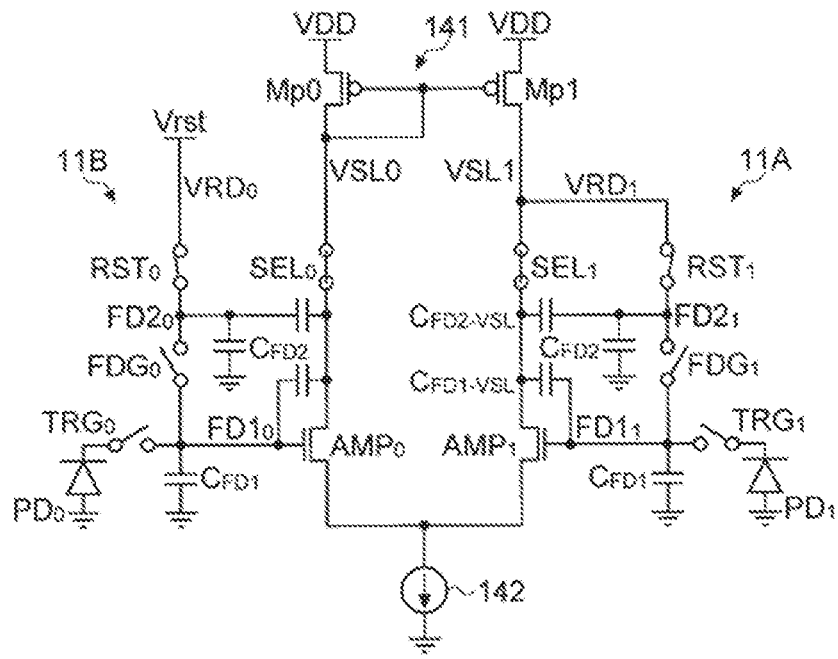
FIG. 13A is a circuit diagram illustrating a connection state of the differential-type amplification read-out configuration in a first read-out mode according to the embodiment.
Figure 13B:
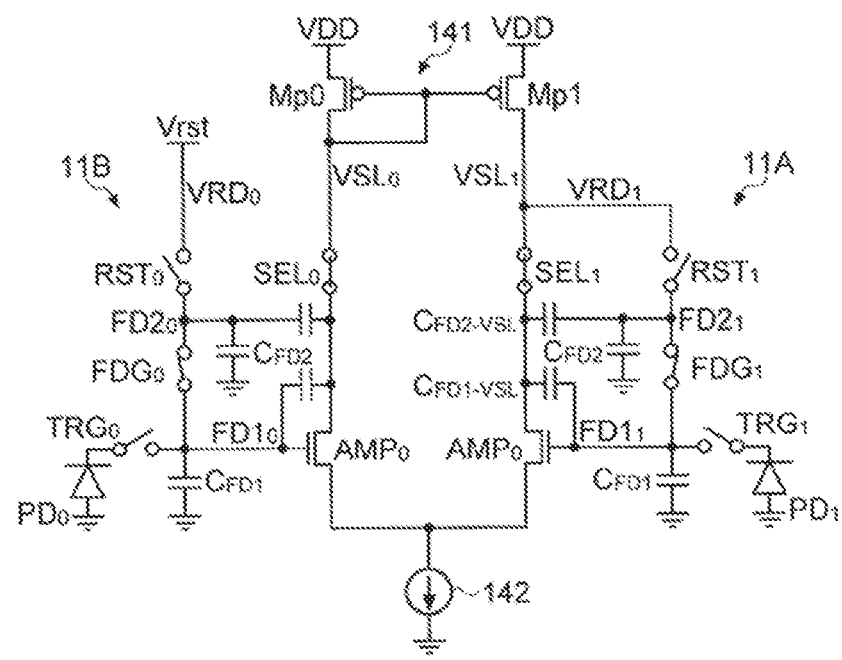
FIG. 13B is a circuit diagram illustrating a connection state of the differential-type amplification read-out configuration in a second read-out mode according to the embodiment.

The following describes the conversion efficiency of differential-type amplification read-out (the first read-out mode and the second read-out mode). FIG. 13A is a circuit diagram illustrating a connection state of the differential-type amplification read-out configuration in the first read-out mode, that is, in a case of causing both of the first reset signals RSTsig/ref input to the signal pixel 11A and the reference pixel 11B to be in High state at all times. FIG. 13B is a circuit diagram illustrating a connection state of the differential-type amplification read-out configuration in the second read-out mode, that is, in a case of causing both of the second reset signals FDGsig/ref input to the signal pixel 11A and the reference pixel 11B to be in High state at all times.

As illustrated in FIG. 13A, in the first read-out mode, both of the reset transistor $RST_1$ of the signal pixel 11A and the reset transistor $RST_0$ of the reference pixel 11B are caused to be in the ON state at all times. In this state, in a case in which open loop gain of the differential amplifier circuit (differential-type amplification read-out configuration) is assumed to be −Av, the conversion efficiency ηvsl thereof is represented by the following expression (3).

$$\eta vsl = \frac{e}{\frac{C_{FD1} + C_{FD1-VSL}}{-Av} + C_{FD1-VSL}} \qquad (3)$$

On the other hand, as illustrated in FIG. 13B, in the second read-out mode, both of the switching transistor $FDG_1$ of the signal pixel 11A and the switching transistor $FDG_0$ of the reference pixel 11B are caused to be in the ON state at all times. The conversion efficiency ↓vsl in this state is represented by the following expression (4).

$$\eta vsl = \frac{e}{\frac{C_{FD1} + C_{FD1-VSL} + C_{FD2} + C_{FD2-VSL}}{-Av} + C_{FD1-VSL} + C_{FD2-VSL}} \qquad (4)$$

As is clear from comparison between the expression (3) and the expression (4), the parasitic capacitance CFD2 of the second floating diffusion FD2 in the signal pixel 11A and the feedback capacitance $C_{FD2-VSL}$ between the second floating diffusion FD2 and the vertical line VSL1 are added to a denominator in the expression (4), so that it can be found that the conversion efficiency ηvsl lowered in the expression (4) as compared with the expression (3). That is, the conversion efficiency ηvsl of the first read-out mode is higher than that of the second read-out mode.

2.9 Driving Example of Source Follower Read-Out Configuration

Next, the following describes a driving example of the source follower read-out configuration. Basically, driving of the source follower read-out configuration may be the same as driving at the time of normal source follower read-out. However, in the present embodiment, there are the third read-out mode in which the first reset signals RSTsig/ref are caused to be in High state at all times, and a fourth read-out mode in which the second reset signals FDGsig/ref are caused to be in High state at all times.

The third read-out mode is a read-out mode using the first floating diffusion FD1 as a transfer destination of the electric charges accumulated in the photodiode PD similarly to the first read-out mode of the differential-type amplification read-out configuration. On the other hand, the fourth read-out mode is a read-out mode using the first floating diffusion FD1 and the second floating diffusion DS2 as transfer destinations of the electric charges accumulated in the photodiode PD similarly to the second read-out mode of the differential-type amplification read-out configuration. Thus, the fourth read-out mode is a read-out mode in which the conversion efficiency ηvsl is lower than that of the third read-out mode.

2.10 Conversion Efficiency of Source Follower Read-Out

Figure 14A:
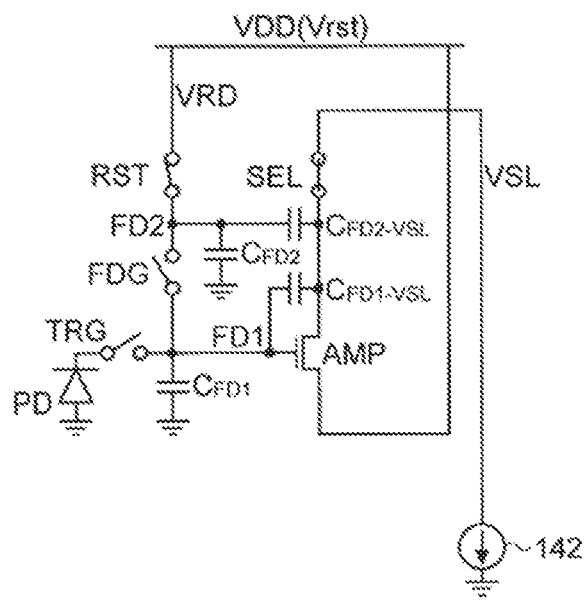
FIG. 14A is a circuit diagram illustrating a connection state of the source follower read-out configuration in a third read-out mode according to the embodiment.
Figure 14B:
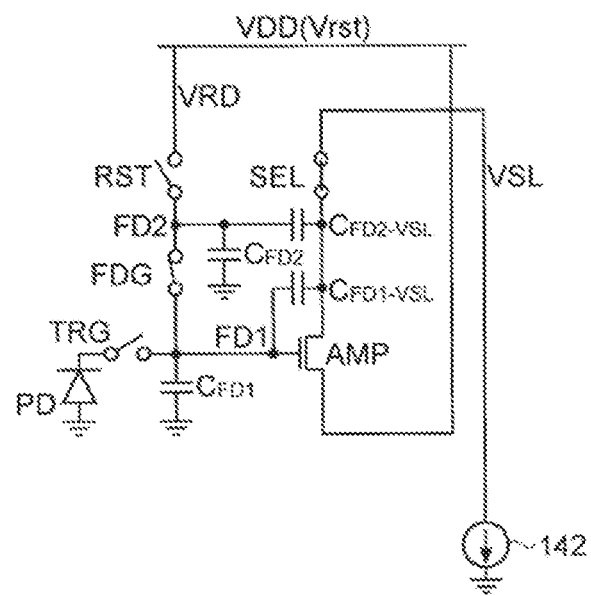
FIG. 14B is a circuit diagram illustrating a connection state of the source follower read-out configuration in a fourth read-out mode according to the embodiment.

Subsequently, the following describes the conversion efficiency of source follower read-out (the third read-out mode and the fourth read-out mode). FIG. 14A is a circuit diagram illustrating a connection state of the source follower read-out configuration in the third read-out mode, that is, in a case of causing the first reset signal RSTsig input to the unit pixel 11 to be read out to be in High state at all times. FIG. 14B is a circuit diagram illustrating a connection state of the source follower read-out configuration in the fourth read-out mode, that is, in a case of causing the second reset signal FDGsig input to the unit pixel 11 to be read out to be in High state at all times.

As illustrated in FIG. 14A, in the third read-out mode, the reset transistor RST of the unit pixel 11 to be read out is in the ON state at all times. In this state, in a case in which voltage gain of the source follower circuit is assumed to be G, the conversion efficiency ηvsl thereof is represented by the following expression (5).

$$\eta vsl = \frac{Ge}{C_{FD1} + (1 - G)C_{FD1-VSL}} \quad (5)$$

On the other hand, as illustrated in FIG. 14B, in the fourth read-out mode, the switching transistor FDG of the unit pixel 11 to be read out is in the ON state at all times. The conversion efficiency ηvsl in this state is represented by the following expression (6).

$$\eta vsl = \frac{Ge}{C_{FD1} + C_{FD2} + (1 - G)(C_{FD1-VSL} + C_{FD2-VSL})} \quad (6)$$

As is clear from comparison between the expression (5) and the expression (6), the parasitic capacitance CFD2 of the second floating diffusion FD2 and the feedback capacitance $C_{FD2-VSL}$ between the second floating diffusion FD2 and the vertical signal line VSL are added to a denominator, so that it can be found that the conversion efficiency ηvsl is lowered in the expression (6) as compared with the expression (5). That is, the conversion efficiency ηvsl of the fourth read-out mode is lower than that of the third read-out mode.

2.11 Relation between Conversion Efficiency of Differential-Type Amplification Read-Out and Conversion Efficiency of Source Follower Read-Out As described above, the conversion efficiency ηvsl of the first read-out mode is higher than that of the second read-out mode in differential-type amplification read-out, and the conversion efficiency ηvsl of the fourth read-out mode is lower than that of the third read-out mode in source follower read-out. Thus, parameters of the respective transistors and wiring constituting the unit pixel 11 are set so that the conversion efficiency ηvsl of the fourth read-out mode is lower than the conversion efficiency ηvsl of the second read-out mode, and the conversion efficiency ηvsl of the first read-out mode is higher than the conversion efficiency ηvsl of the third read-out mode.

Accordingly, the second read-out mode and the third read-out mode having intermediate conversion efficiency ηvsl can be disposed between the first read-out mode of differential-type amplification read-out having the highest conversion efficiency ηvsl and the fourth read-out mode of source follower read-out having the lowest conversion efficiency ηvsl.

In this way, by disposing the read-out mode (the second read-out mode and the third read-out mode) having the conversion efficiency ηvsl as a link at the time of switching between differential-type amplification read-out and source follower read-out, it becomes possible to reduce variations in the output signal level, the total noise, and the like of the taken image generated at the time of switching between differential-type amplification read-out and source follower read-out. Accordingly, for example, it becomes possible to suppress deterioration of image quality in a case of incorporating the configuration of switching between source follower read-out and differential-type amplification read-out into the AE control system.

The conversion efficiency ηvsl of the second read-out mode may be higher conversion efficiency, lower conversion efficiency, or equivalent conversion efficiency as compared with the conversion efficiency ηvsl of the third read-out mode.

2.12 Combination Example of Unit Pixels Forming Differential-Type Amplification Read-Out Configuration Next, the following describes a combination of the unit pixels 11 forming the differential-type amplification read-out configuration according to the present embodiment with several examples.

2.12.1 First Combination Example

Figure 15:
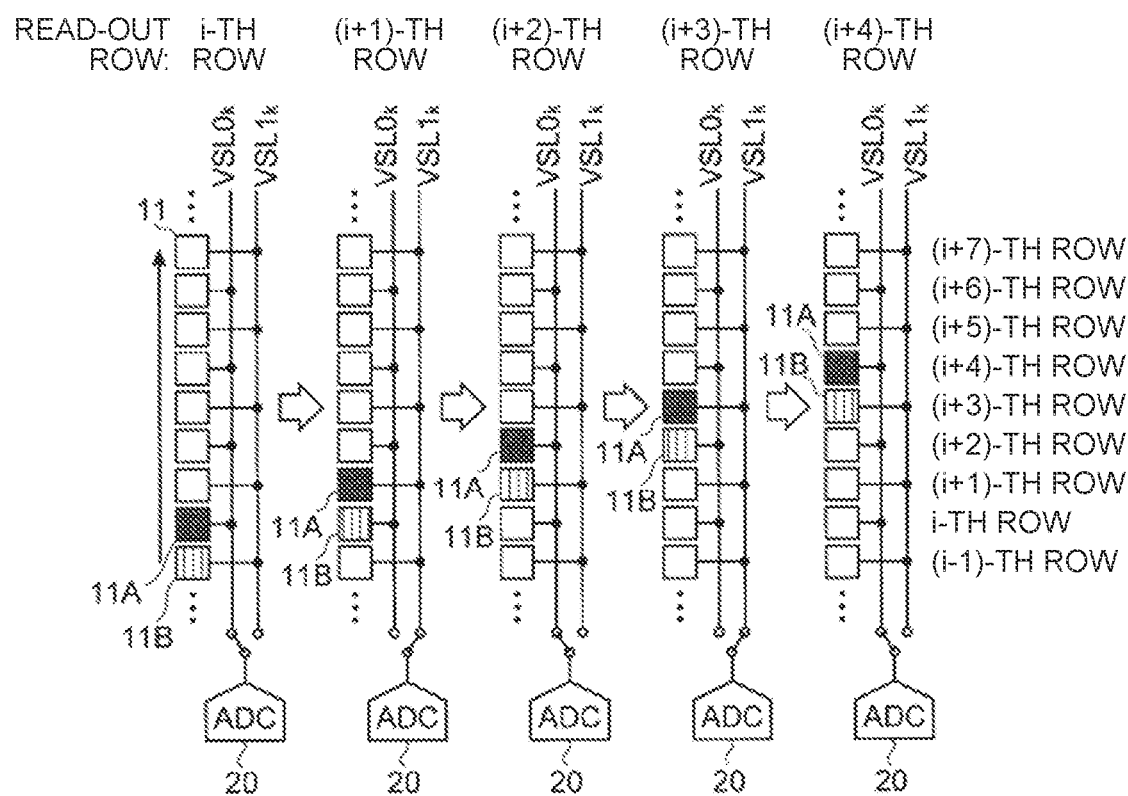
FIG. 15 is a schematic diagram for explaining a first combination example of unit pixels forming the differential-type amplification read-out configuration according to the embodiment.

FIG. 15 is a schematic diagram for explaining a first combination example according to the present embodiment. In FIG. 15, as described above with reference to FIG. 8, for example, the selection transistor $SEL_i$ of the unit pixel $11_i$ in the odd-numbered row is assumed to be connected to the vertical signal line $VSL0_k$, and the selection transistor $SEL_{i+1}$ of the unit pixel $11_{i+1}$ in the even-numbered row is assumed to be connected to the vertical signal line $VSL1_k$.

In a case in which the unit pixels 11 arranged in the column direction are alternately connected to different vertical signal lines VSL, as illustrated in FIG. 15, in the first combination example, the two unit pixels 11 adjacent to each other among the unit pixels 11 arranged in the column direction are selected as the signal pixel 11A and the reference pixel 11B. For example, at the time of reading out the i-th row, the unit pixel $11_i$ is selected as the signal pixel 11A, and the unit pixel $11_{i-1}$ is selected as the reference pixel 11B.

Subsequently, at the time of reading out the (i+1)-th row, the unit pixel $11_{i-1}$ is selected as the signal pixel 11A, and the unit pixel $11_i$ is selected as the reference pixel 11B. Thereafter, the row of the unit pixel 11 selected as the reference pixel 11B (hereinafter, referred to as a reference row) is switched along with switching of the row of the unit pixel 11 selected as the signal pixel 11A (hereinafter, referred to as a read-out row).

In the first combination example, however, the reference row is not limited to a row that is caused to be the read-out row immediately before the read-out row, but may be a row to be selected as the read-out row next.

2.12.2 Second Combination Example

Figure 16:
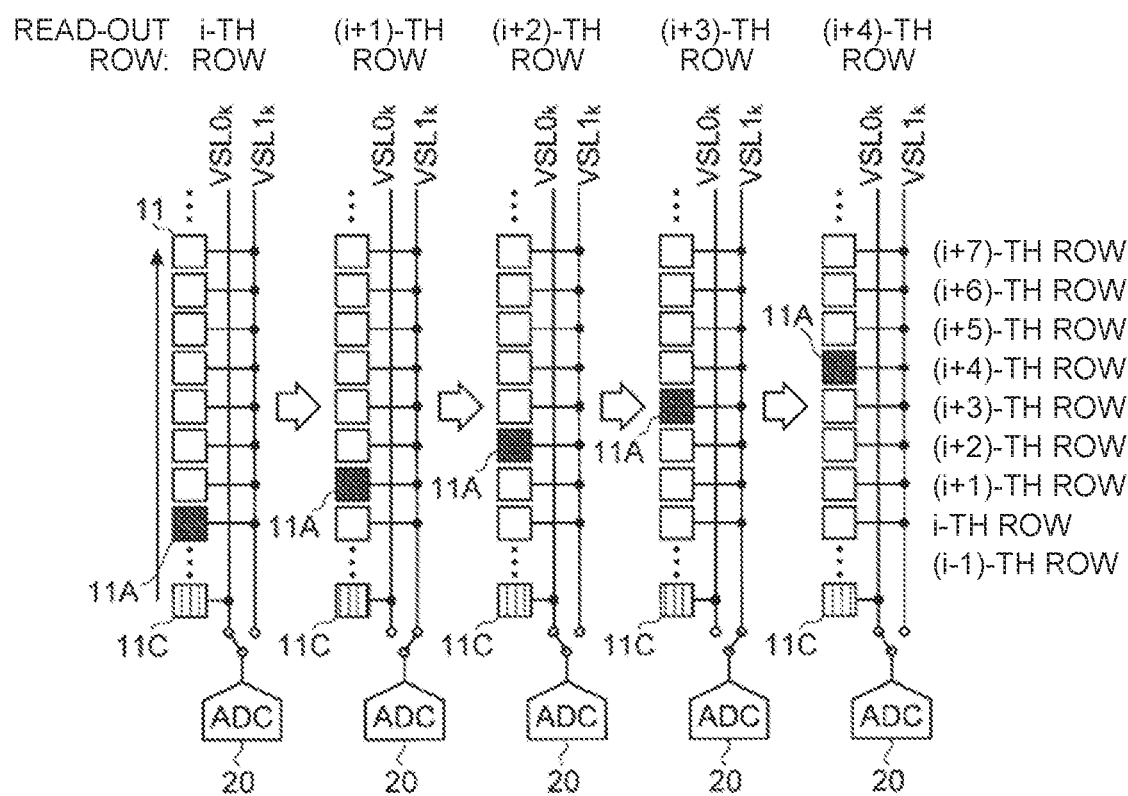
FIG. 16 is a schematic diagram for explaining a second combination example of unit pixels forming the differential-type amplification read-out configuration according to the embodiment.

FIG. 16 is a schematic diagram for explaining a second combination example according to the present embodiment. As illustrated in FIG. 16, in the second combination example, the reference row is fixed to a specific row. The reference row may be, for example, a row other than the effective pixel region of the pixel array unit 10. In this case, a reference pixel 11C in the reference row is connected to the vertical signal line VSL0$_k$, and all of the unit pixels 11 in the effective pixel region including the signal pixel 11A are connected to the vertical signal line VSL1$_j$. Similarly to the reference pixel 11B, the reference pixel 11C may have the same configuration as that of the normal unit pixel 11.

Figure 17:
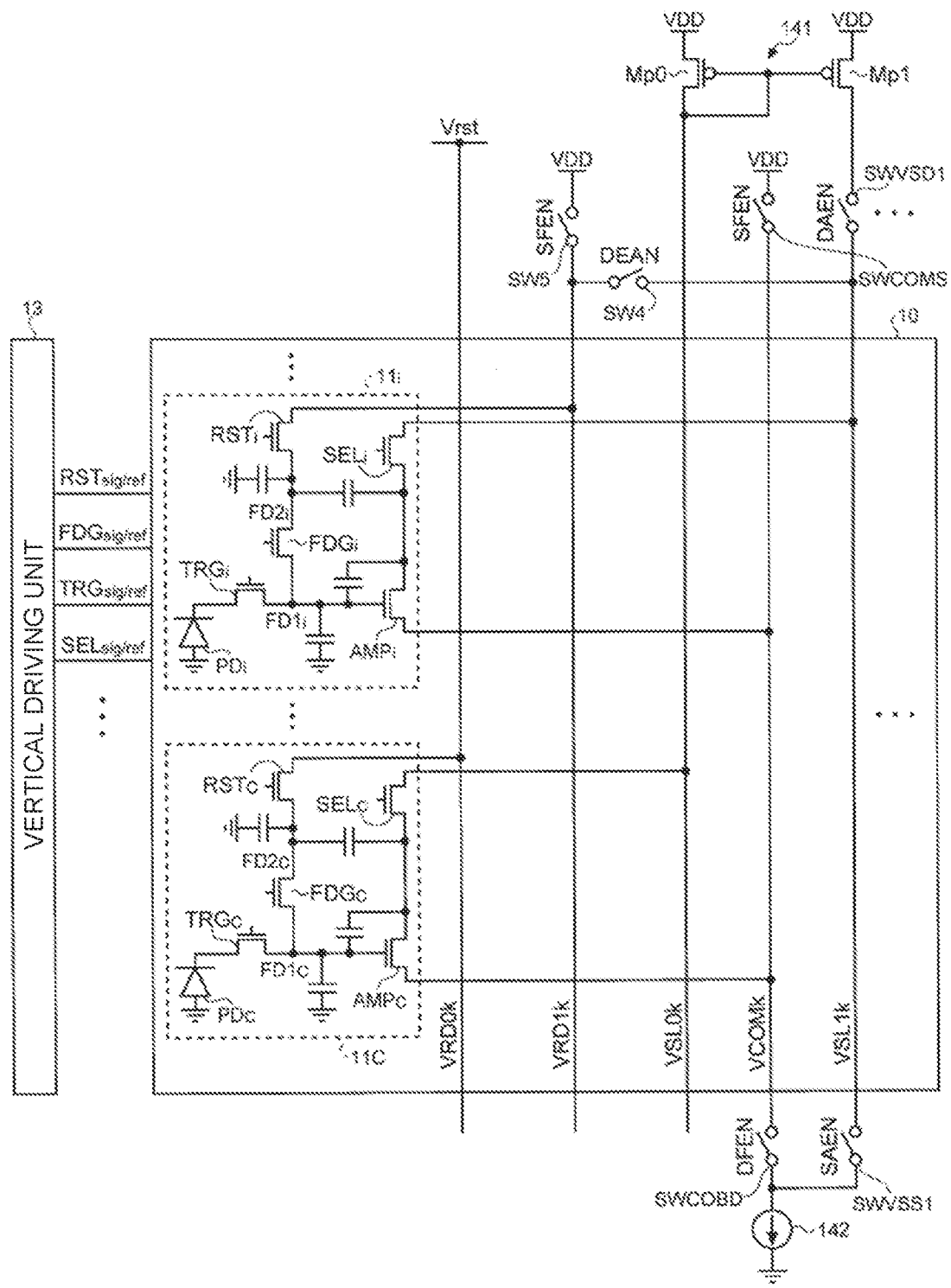
FIG. 17 is a circuit diagram illustrating a schematic configuration example of a differential-type amplification read-out configuration and peripheral circuits thereof according to a modification of the embodiment.

2.12.2.1 Modification of Peripheral Circuits of Differential-Type Amplification Read-Out Configuration in the Case of Second Combination Example As in a second combination example, in a case of fixing the reference row, the configuration of the differential-type amplification read-out configuration including the peripheral circuits may be a configuration exemplified in FIG. 17 instead of the configuration exemplified in FIG. 8.

In the configuration exemplified in FIG. 17, unlike the configuration exemplified in FIG. 8, a source of a reset transistor RST$_c$ of a reference pixel 11C is connected to the vertical reset input line VRD0$_k$, and sources of reset transistors RST$_{i+1}$ of all unit pixels 11$_i$ are connected to the vertical reset input line VRD1$_k$. The vertical reset input line VRD0$_k$ is connected to the predetermined power supply Vrst. Additionally, the vertical reset input line VRD1$_k$ is connected to the power supply voltage VDD via a switch SW5 to which the enable signal SFEN of High level is input at the time of source follower read-out, and connected to the vertical signal line VSL1$_k$ via a switch SW4 to which the enable signal DAEN of High level is input at the time of differential-type amplification read-out.

In the configuration exemplified in FIG. 17, the switch SWVSD0 on one end side of the vertical signal line VSL0$_k$ to which the source of the selection transistor SEL$_c$ is connected in the reference pixel 11C is omitted, and the other end thereof is not connected to the tail current source unit 142. A connection configuration between the drain and the gate via the switch SW2 or SW3 in the two PMOS transistors MP0 and Mp1 constituting the current mirror circuit 141 is replaced with a configuration of a normal current mirror circuit that connects the drain of the PMOS transistor Mp0 with the gates of the PMOS transistors Mp0 and Mp1.

With such a configuration, the enable signal DAEN of High level and the enable signal SFEN of Low level are input to the respective switches SW at the time of differential-type amplification read-out. Due to this, the switches SWVSD1, SWCOMD, and SW4 are caused to be in the ON state, and the switches SWCOMS, SWVSS1, and SW5 are caused to be in the OFF state. On the other hand, at the time of source follower read-out, the enable signal DAEN of Low level and the enable signal SFEN of High level are input to the respective switches SW. Due to this, the switches SWVSD1, SWCOMD, and SW4 are caused to be in the OFF state, and the switches SWCOMS, SWVSS1, and SW5 are caused to be in the ON state.

2.13 Modification of Circuit Configuration of Unit Pixel

Next, the following describes a modification of the circuit configuration of the unit pixel 11 according to the present embodiment with several examples. As a reference, the circuit configuration example of the unit pixel 11 according to the present embodiment illustrated in FIG. 6 is illustrated in FIG. 18A again. In the unit pixel 11 illustrated in FIG. 6 and FIG. 18A, the feedback capacitance C$_{FD1-VSL}$ is formed between a node connecting the transfer transistor TRF with the amplification transistor AMP and a node connecting the amplification transistor AMP with the selection transistor SEL, and the feedback capacitance C$_{FD2-VSL}$ is formed between a node connecting the reset transistor RST with the switching transistor FDG and a node connecting the amplification transistor AMP with the selection transistor SEL.

2.13.1 First Modification

Figure 18A:
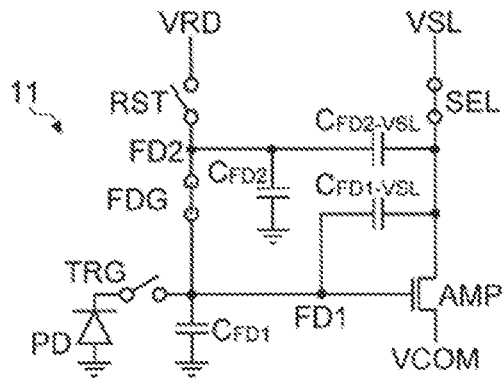
FIG. 18A is a circuit diagram illustrating a configuration example of a unit pixel according to the embodiment.
Figure 18B:
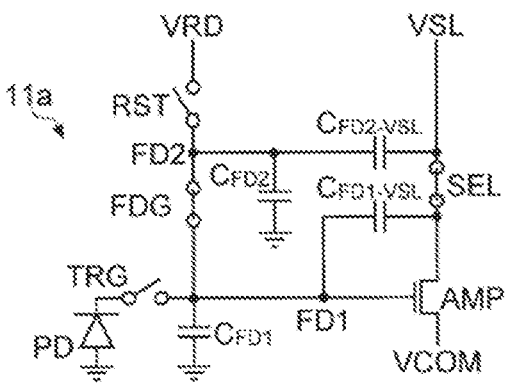
FIG. 18B is a circuit diagram illustrating a first modification of the unit pixel according to the embodiment.

FIG. 18B is a circuit diagram illustrating a first modification of the unit pixel according to the present embodiment. As illustrated in FIG. 18B, a unit pixel 11$a$ according to the first modification is different from the unit pixel 11 illustrated in FIG. 18A in that the feedback capacitance C$_{FD2-VSL}$ is formed between the node connecting the reset transistor RST with the switching transistor FDG and the vertical signal line VSL.

2.13.2 Second Modification

Figure 18C:
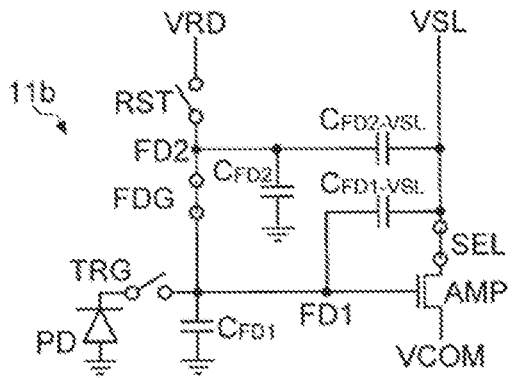
FIG. 18C is a circuit diagram illustrating a second modification of the unit pixel according to the embodiment.

FIG. 18C is a circuit diagram illustrating a second modification of the unit pixel according to the present embodiment. As illustrated in FIG. 18C, a unit pixel 11$b$ according to the second modification is different from the unit pixel 11 illustrated in FIG. 18A in that the feedback capacitance C$_{FD2-VSL}$ is formed between the node connecting the reset transistor RST with the switching transistor FDG and the vertical signal line VSL, and the feedback capacitance C$_{FD1-VSL}$ is formed between the node connecting the transfer transistor TRF with the amplification transistor AMP and the vertical signal line VSL.

2.13.3 Third Modification

Figure 19A:
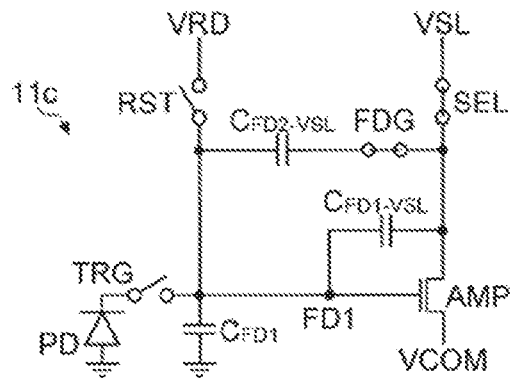
FIG. 19A is a circuit diagram illustrating a third modification of the unit pixel according to the embodiment.

FIG. 19A is a circuit diagram illustrating a third modification of the unit pixel according to the present embodiment. As illustrated in FIG. 19A, a unit pixel 11$c$ according to the third modification is configured to be able to divide the feedback capacitance between the first floating diffusion FD1 and the vertical signal line VSL into the capacitance C$_{FD1-VSL}$ and the capacitance C$_{FD2-VSL}$, and separate the capacitance C$_{FD2-VSL}$ from a pixel circuit by the switching transistor FDG as needed.

For example, the capacitance C$_{FD1-VSL}$ may be parasitic capacitance between the gate and the drain of the amplification transistor AMP. On the other hand, the capacitance C$_{FD2-VSL}$ that can be electrically separated may be, for example, capacitance that is intentionally added by a capacitive element or a metal layer (hereinafter, collectively referred to as a capacitive element including the metal layer). In this case, the capacitive element forming the capacitance C$_{FD2-VSL}$ functions as a charge accumulation unit in place of the second floating diffusion FD2.

With this configuration, the second floating diffusion FD2 can be omitted. In such a case, a term of the parasitic capacitance C$_{FD2}$ in the expression (3) to the expression (6) described above is omitted.

2.13.4 Fourth Modification

Figure 19B:
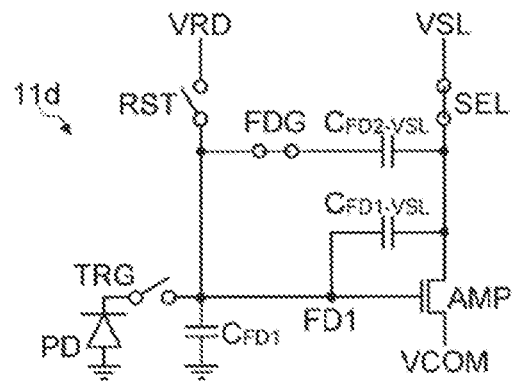
FIG. 19B is a circuit diagram illustrating a fourth modification of the unit pixel according to the embodiment.

FIG. 19B is a circuit diagram illustrating a fourth modification of the unit pixel according to the present embodiment. As in the unit pixel 11$c$ illustrated in FIG. 19A and the unit pixel 11$d$ illustrated in FIG. 19B, the switching transistor FDG may be disposed on the first floating diffusion FD1 side (the third modification, refer to FIG. 19A), or may be disposed on the vertical signal line VSL side (the fourth modification, refer to FIG. 19B) with respect to the feedback capacitance C$_{FD2-VSL}$.

2.13.5 Fifth Modification

Figure 20:
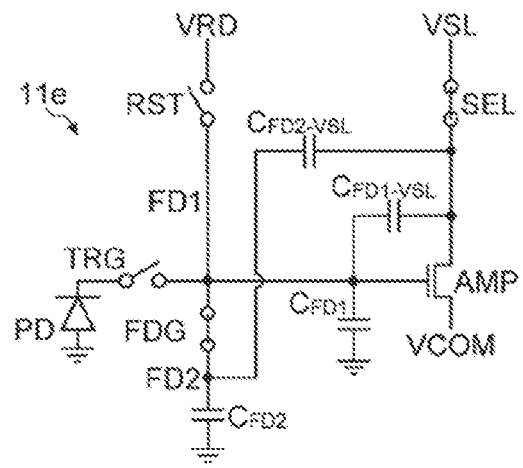
FIG. 20 is a circuit diagram illustrating a fifth modification of the unit pixel according to the embodiment.

FIG. 20 is a circuit diagram illustrating a fifth modification of the unit pixel according to the present embodiment. As illustrated in FIG. 20, a unit pixel 11$e$ according to the fifth modification has a configuration in which the second floating diffusion FD2 is disposed between a node forming the first floating diffusion FD1 and grounding, the switching transistor FDG is disposed between the first floating diffusion FD1 and the second floating diffusion FD2, and the reset transistor RST is disposed between the first floating diffusion FD1 and the vertical reset input line VRD.

2.13.6 Sixth Modification

Figure 21:
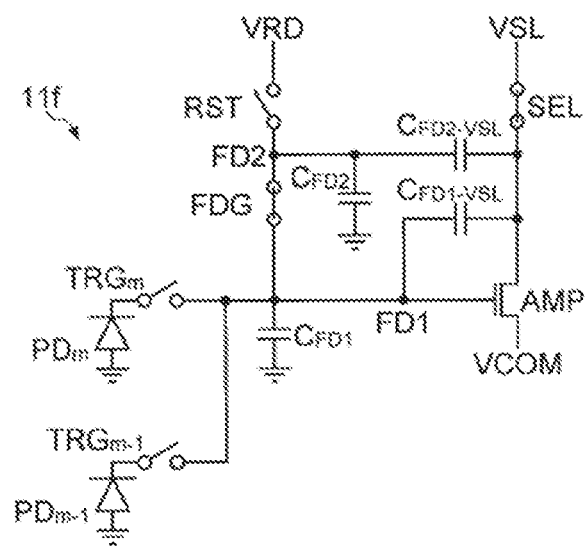
FIG. 21 is a circuit diagram illustrating a sixth modification of the unit pixel according to the embodiment.

FIG. 21 is a circuit diagram illustrating a sixth modification of the unit pixel according to the present embodiment. As illustrated in FIG. 21, a unit pixel 11f according to the sixth modification has a configuration in which a plurality of photodiodes PDm-1 and PDm, and a plurality of transfer transistors TRGm-1 and TRGm share the other circuit configurations (the reset transistor RST, the switching transistor FDG, the selection transistor SEL, the amplification transistor AMP, the first floating diffusion FD1, the second floating diffusion FD2, and the like). In other words, the unit pixel 11f has a configuration of sharing the reset transistor RST, the switching transistor FDG, the selection transistor SEL, the amplification transistor AMP, the first floating diffusion FD1, the second floating diffusion FD2, and the like with the unit pixel 11 adjacent thereto.

FIG. 21 exemplifies a case in which the two adjacent unit pixels 11 among the unit pixels 11 arranged in the column direction share the circuit configurations, but the embodiment is not limited thereto. The embodiment can be variously modified such that three or more of the unit pixels 11 share the circuit configurations, for example.

As described above, the unit pixel 11 according to the present embodiment is not limited the circuit configurations exemplified in FIG. 6 and FIG. 18A, and can be variously modified.

2.14 Cross-Sectional Structure Example of Unit Pixel

Next, the following describes a cross-sectional structure of the unit pixel 11 according to the embodiment with several examples.

2.14.1 First Example

A first example describes a cross-sectional structure of the unit pixel 11 of surface irradiation type using examples. In the present description, the surface irradiation type is assumed to be a structure in which an element forming surface on a semiconductor substrate is assumed to be a surface, and light is incident on the photodiode PD from this surface side.

Figure 22A:
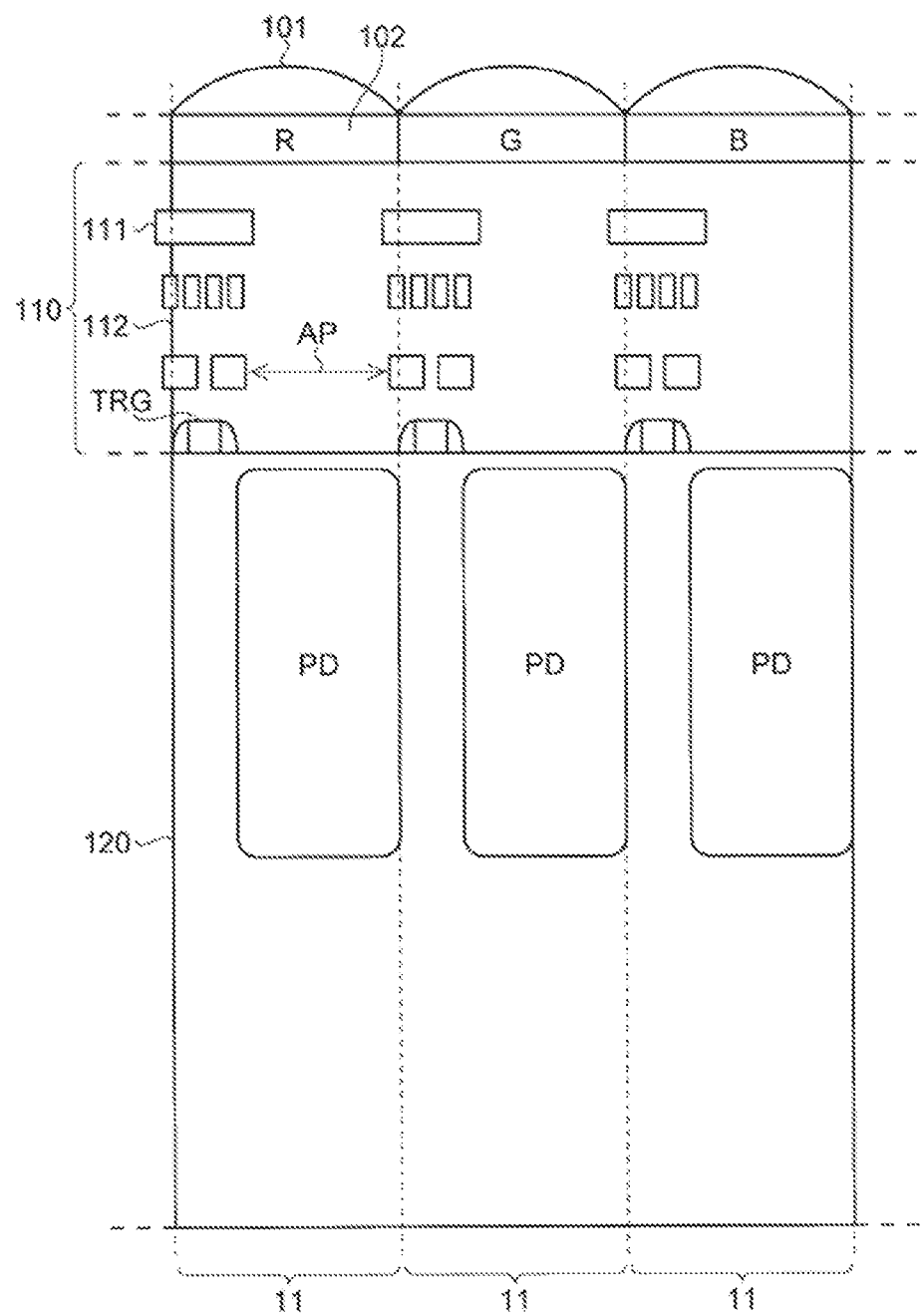
FIG. 22A is a cross-sectional view illustrating a cross-sectional structure example of a unit pixel according to a first example of the embodiment.

FIG. 22A is a cross-sectional view illustrating a cross-sectional structure example of the unit pixel according to the first example of the present embodiment. In FIG. 22A, an upper side is assumed to be a surface (also referred to as an upper surface). FIG. 22A illustrates a cross section of a surface perpendicular to the surface.

As illustrated in FIG. 22A, the unit pixel 11 of surface irradiation type includes a semiconductor substrate 120 and a wiring layer 110 disposed on an upper surface of the semiconductor substrate 120. In the vicinity of the upper surface of the semiconductor substrate 120, the photodiodes PD that are two-dimensionally arranged in a matrix are formed.

The wiring layer 110 has a structure in which an insulating film 112 such as a silicone oxide film covers the transfer transistor TRG that is electrically connected to each of the photodiodes PD on the semiconductor substrate 120, wiring 111 that connects the transfer transistor TRG to the other pixel transistor (such as the reset transistor RST, the switching transistor FDG, the amplification transistor AMP, and the selection transistor SEL), and the like. The transfer transistor TRG and the wiring 111 are disposed at positions shifted from an upper side of the photodiode PD, and a light receiving unit opening area AP through which light is incident on the photodiode PD is disposed on the upper side of the photodiode PD accordingly.

On a flattened upper surface of the wiring layer 110, a color filter 102 that selectively transmits light having a specific wavelength and an on-chip lens 101 that collects incident light to the photodiode PD are disposed for each of the unit pixels 11.

Although not illustrated, in a region other than a formation region of the photodiode PD on the semiconductor substrate 120 and/or the wiring layer 110 corresponding to this region, the pixel transistor other than the transfer transistor TRG (such as the reset transistor RST, the switching transistor FDG, the amplification transistor AMP, and the selection transistor SEL), the column read-out circuit unit 14, the column signal processing unit 15, other peripheral circuits, or the like may be disposed.

This surface irradiation type is advantageous in facilitating design and lowering production costs, for example.

2.14.2 Second Example

A second example describes a cross-sectional structure of the unit pixel 11 of back surface irradiation type using examples. In the present description, the back surface irradiation type is assumed to be a structure in which an opposite side of the element forming surface on the semiconductor substrate is assumed to be a back surface, and light is incident on the photodiode PD from this back surface side.

FIG. 22B is a cross-sectional view illustrating a cross-sectional structure example of the unit pixel according to the second example of the present embodiment. In FIG. 22B, an upper side is assumed to be a back surface. FIG. 22B illustrates a cross section of a surface perpendicular to the back surface.

As illustrated in FIG. 22B, the unit pixel 11 of back surface irradiation type includes a semiconductor substrate 220, the wiring layer 110 disposed on a surface side of the semiconductor substrate 220, and a support substrate 130 disposed on the upper surface of the wiring layer 110.

In the vicinity of a surface of the semiconductor substrate 220, similarly to the semiconductor substrate 120 illustrated in FIG. 22A, the photodiodes PD that are two-dimensionally arranged in a matrix are formed. However, the semiconductor substrate 220 is shaven by Chemical Mechanical Polishing (CMP) and the like from the back surface side to be thinned so that the photodiode PD is also positioned in the vicinity of the back surface.

Similarly to the wiring layer 110 illustrated in FIG. 22A, the wiring layer 110 has a structure in which the insulating film 112 covers the transfer transistor TRG, the wiring 111, and the like. However, in a case of the back surface irradiation type, the light receiving opening AP through which light is incident on the photodiode PD is not necessarily disposed in the wiring layer 110.

On the flattened back surface of the semiconductor substrate 220, the color filter 102 that selectively transmits light having a specific wavelength and the on-chip lens 101 that collects incident light to the photodiode PD are disposed for each of the unit pixels 11.

The support substrate 130 is joined to the flattened upper surface of the wiring layer 110. The support substrate 130 may be, for example, a semiconductor substrate such as a silicon substrate. On the support substrate 130, for example, the pixel transistor other than the transfer transistor TRG (such as the reset transistor RST, the switching transistor FDG, the amplification transistor AMP, and the selection transistor SEL), the column read-out circuit unit 14, the column signal processing unit 15, other peripheral circuits, or the like may be formed.

In this way, by causing the unit pixel 11 to have the pixel structure of back surface irradiation type, the opening through which light is incident on the photodiode PD can be made larger than that of the surface irradiation type. Accordingly, pixel characteristics such as sensitivity and full well capacity can be improved.

2.15 Structure Example of CMOS Image Sensor

Next, the following describes a structure of the CMOS image sensor 1 according to the embodiment with several examples.

2.15.1 First Example

Figure 23A:
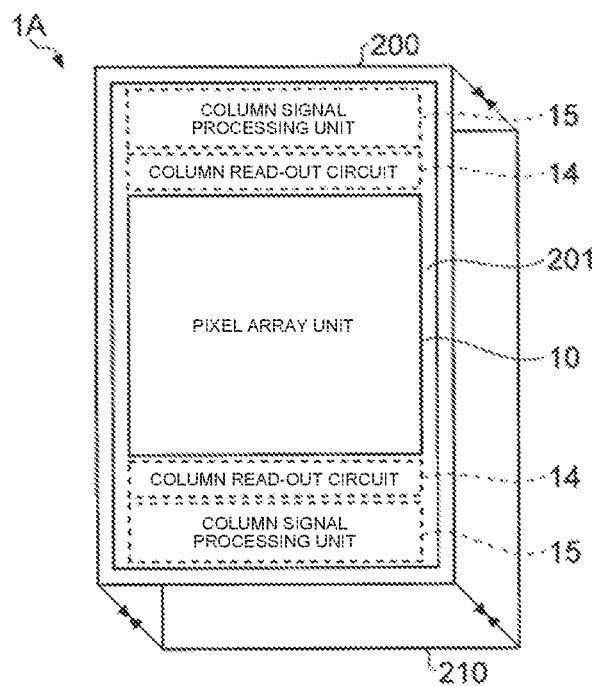
FIG. 23A is a schematic diagram illustrating a schematic structure example of a CMOS image sensor according to the first example of the embodiment.

FIG. 23A is a schematic diagram illustrating a schematic structure example of the CMOS image sensor according to the first example of the present embodiment. As illustrated in FIG. 23A, a CMOS image sensor 1A according to the first example has a laminated structure in which a semiconductor substrate 200 is joined to a support substrate 210.

On the semiconductor substrate 200, the pixel array unit 10, the column read-out circuit unit 14, the column signal processing unit 15, another peripheral circuit 201 (such as the system control unit 12, the vertical driving unit 13, the horizontal driving unit 16, the signal processing unit 17, the pixel driving line LD, and the vertical pixel wiring LV) are disposed. Each of the unit pixels 11 in the pixel array unit 10 may be, for example, the surface irradiation type illustrated in FIG. 22A, or the back surface irradiation type illustrated in FIG. 22B.

The support substrate 210 is a member for enhancing strength of the CMOS image sensor 1A, and may be various substrates including, for example, a semiconductor substrate such as a silicon substrate, an insulating substrate such as a ceramic substrate, and the like. In a case in which each of the unit pixels 11 in the pixel array unit 10 is the surface irradiation type, the support substrate 210 is not necessarily disposed.

2.15.2 Second Example

Figure 23B:
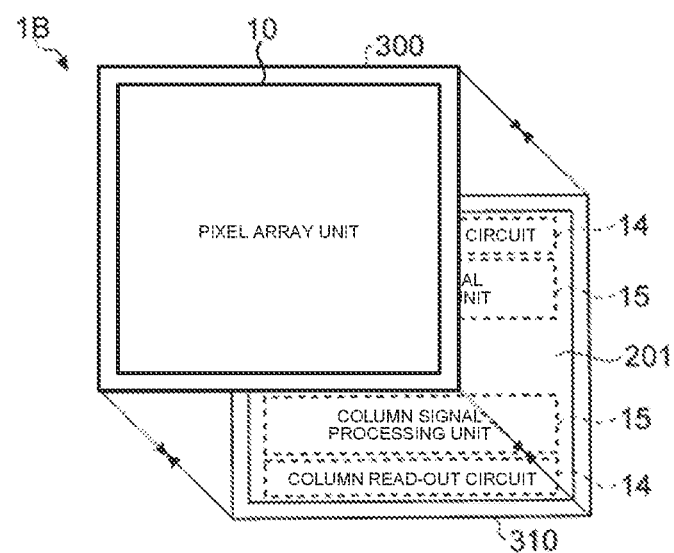
FIG. 23B is a schematic diagram illustrating a schematic structure example of a CMOS image sensor according to the second example of the embodiment.

FIG. 23B is a schematic diagram illustrating a schematic structure example of the CMOS image sensor according to a second example of the present embodiment. As illustrated in FIG. 23B, a CMOS image sensor 1B according to the second example has a laminated structure in which, for example, a first semiconductor substrate 300 and a second semiconductor substrate 310 are joined to each other by plasma joining, Cu—Cu bonding, and the like.

For example, the pixel array unit 10 is disposed on the first semiconductor substrate 300. On the other hand, on the second semiconductor substrate 310, the column read-out circuit unit 14, the column signal processing unit 15, and the other peripheral circuit 201 are disposed. Each of the unit pixels 11 in the pixel array unit 10 may be, for example, the surface irradiation type illustrated in FIG. 22A, or the back surface irradiation type illustrated in FIG. 22B.

In this way, by making a laminated configuration by disposing the configurations other than the pixel array unit 10 on the second semiconductor substrate 310 different from the first semiconductor substrate 300 on which the pixel array unit 10 is disposed, the CMOS image sensor 1B can be downsized. Additionally, the pixel array unit 10 and the other circuit configurations can be formed through separate production processes, so that reduction in production costs, improvement in performance, and the like can be easily achieved.

2.16 Function and Effect

As described above, according to the present embodiment, the second read-out mode and the third read-out mode having the intermediate conversion efficiency ηvsl can be disposed between the first read-out mode of differential-type amplification read-out having the highest conversion efficiency ηvsl and the fourth read-out mode of source follower read-out having the lowest conversion efficiency ηvsl. Due to this, the maximum number of electrons that can be read out can be increased while maintaining a low noise characteristic of differential-type amplification read-out. That is, at the time of switching from source follower read-out to differential-type amplification read-out, or vice versa, the switching can be performed through the read-out mode having the intermediate conversion efficiency ηvsl, so that source follower read-out and differential-type amplification read-out can be switched while suppressing deterioration of image quality.

As described above, in the present embodiment, the first read-out mode of differential-type amplification read-out is the read-out mode having the highest conversion efficiency ηvsl with low noise. On the other hand, the fourth read-out mode of source follower read-out is the read-out mode having the lowest conversion efficiency ηvsl, for example, a read-out mode that can read out the number of input electrons of the entire full well capacity of the photodiode PD.

The second read-out mode of differential-type amplification read-out is a read-out mode in which the conversion efficiency ηvsl is lowered as compared with the first read-out mode, and the maximum number of electrons that can be read out is increased. On the other hand, the third read-out mode of source follower read-out is a read-out mode having the conversion efficiency ηvsl that is substantially the same as that of the second read-out mode, for example.

In this way, by causing the second read-out mode and the third read-out mode to have substantially the same conversion efficiency ηvsl, an unnatural output signal and a noise level difference can be reduced at the time of switching from source follower read-out to differential-type amplification read-out, or vice versa. However, the conversion efficiency ηvsl of the third read-out mode may be lower or higher than the conversion efficiency ηvsl of the second read-out mode.

The embodiment of the present disclosure has been described above, but a technical scope of the present disclosure is not limited to the embodiment described above as it is, and can be variously modified without departing from the gist of the present disclosure. The constituent elements throughout the different embodiments and modifications may be combined with each other as appropriate.

The effects of the respective embodiments described herein are merely examples, and the effects are not limited thereto. Other effects may be exhibited.

The present technique may employ the configurations as described below.

(1)

A solid-state imaging device comprising:
    a first vertical signal line and a second vertical signal line;
    a current mirror circuit connected to the first and the second vertical signal lines;
    a first unit pixel connected to the first vertical signal line;
    a second unit pixel connected to the second vertical signal line;
    a current supply line connected to the first and the second unit pixels; and
    a constant current circuit connected to the current supply line, wherein
    each of the first and the second unit pixels comprises:
        a photoelectric conversion element configured to photoelectrically convert incident light;
        a transfer transistor configured to transfer an electric charge generated in the photoelectric conversion element;

first and second charge accumulation units configured to accumulate the electric charge transferred by the transfer transistor;

a switching transistor configured to control accumulation of the electric charge by the second charge accumulation unit; and an amplification transistor configured to cause a voltage corresponding to electric charges accumulated in the first charge accumulation unit, or the first and the second charge accumulation units, to appear in the first or the second vertical signal line, a drain of the amplification transistor of the first unit pixel is connected to the first vertical signal line, a drain of the amplification transistor of the second unit pixel is connected to the second vertical signal line, and a source of the amplification transistor of the first unit pixel and a source of the amplification transistor of the second unit pixel are connected to the current supply line.

(2)

The solid-state imaging device according to (1), further comprising:

a reset transistor configured to discharge the electric charges accumulated in the first and the second charge accumulation units.

(3)

The solid-state imaging device according to (1) or (2), wherein each of the first and the second unit pixels further comprises a selection transistor connected between the drain of the amplification transistor and the first or the second vertical signal line.

(4)

The solid-state imaging device according to any one of (1) to (3), wherein the first charge accumulation unit includes a first capacitance component disposed at a first node connecting a drain of the transfer transistor with a gate of the amplification transistor, and a second capacitance component between the first node and a second node on the drain side of the amplification transistor, and the second charge accumulation unit includes a third capacitance component disposed at a third node on the drain side of the transfer transistor, and a fourth capacitance component between the third node and a fourth node on the drain side of the amplification transistor.

(5)

The solid-state imaging device according to (4), wherein at least one of the first to the fourth capacitance components is a capacitance component that is added by using a capacitive element or a metal layer.

(6)

The solid-state imaging device according to any one of (1) to (5), wherein a source of the transfer transistor is connected to the photoelectric conversion element, a drain of the transfer transistor is connected to a gate of the amplification transistor and a source of the switching transistor, the first charge accumulation unit is disposed at a node connecting the drain of the transfer transistor with the gate of the amplification transistor, and the second charge accumulation unit is disposed at a node connecting the drain of the transfer transistor with the source of the switching transistor.

(7)

The solid-state imaging device according to any one of (1) to (5), wherein each of the first and the second unit pixels further comprises:

wiring configured to connect a drain of the transfer transistor with the first or the second vertical signal line; and a capacitive element disposed on the wiring, a source of the transfer transistor is connected to the photoelectric conversion element, the drain of the transfer transistor is connected to a gate of the amplification transistor, and the switching transistor is disposed on the wiring.

(8)

The solid-state imaging device according to (7), wherein the capacitive element is disposed between the drain of the transfer transistor and a source of the switching transistor.

(9)

The solid-state imaging device according to (7), wherein the capacitive element is disposed between a drain of the switching transistor and the first or the second vertical signal line.

(10)

The solid-state imaging device according to any one of (1) to (5), wherein a source of the transfer transistor is connected to the photoelectric conversion element, a drain of the transfer transistor is connected to a gate of the amplification transistor and a drain of the switching transistor, the first charge accumulation unit is disposed at a node connecting the drain of the transfer transistor with the gate of the amplification transistor, and the second charge accumulation unit is disposed between a source of the switching transistor and grounding.

(11)

The solid-state imaging device according to any one of (1) to (10), wherein a gate cf the amplification transistor of each of the first and the second unit pixels is connected to a drain of a transfer transistor that is disposed in another unit pixel.

(12)

The solid-state imaging device according to any one, of (1) to (11), comprising:

a first switch configured to switch connection between the first vertical signal line and the current mirror circuit;

a second switch configured to switch connection between the second vertical signal line and the current mirror circuit;

a third switch configured to switch connection between the current supply line and the constant current circuit;

a fourth switch configured to switch connection between the first vertical signal line and the constant current circuit;

a fifth switch configured to switch connection between the second vertical signal line and the constant current circuit; and a sixth switch configured to switch connection between the current supply line and a power supply voltage.

(13)

The solid-state imaging device according to (12), wherein the first to the third switches are caused to be in an ON state during a period of a differential read-out mode, and caused to be in an OFF state during a period of a source follower read-out mode, and the fourth to the sixth switches are caused to be in an OFF state during the period of the differential read-out mode, and caused to be in an ON state during the period of the source follower read-out mode.

(14)

The solid-state imaging device according to any one of (1) to (11), comprising:
a first switch configured to switch connection between the first vertical signal line and the current mirror circuit;
a second switch configured to switch connection between the current supply line and the constant current circuit;
a third switch configured to switch connection between the first vertical signal line and the constant current circuit; and
a fourth switch configured to switch connection between the current supply line and a power supply voltage.

(15)

The solid-state imaging device according to (14), wherein the first and the second switches are caused to be in an ON state during a period of a differential read-out mode, and caused to be in an OFF state during a period of a source follower read-out mode, and
the third and the fourth switches are caused to be in an OFF state during the period of the differential read-out mode, and caused to be in an ON state during the period of the source follower read-out mode.

(16)

The solid-state imaging device according to any one of (1) to (15), comprising:
a plurality of unit pixels including the first and the second unit pixels, wherein
the unit pixels are two-dimensionally arranged in a matrix, and
the first unit pixel and the second unit pixel are arranged in a same column.

(17)

The solid-state imaging device according to (16), wherein the second unit pixel is adjacent to the first unit pixel in the same column.

(18)

The solid-state imaging device according to (16), wherein the second unit pixel is a fixed unit pixel in the same column.

(19)

The solid-state imaging device according to any one of (1) to (18), further comprising:
a read-out circuit that is connected to the first and the second vertical signal lines, and configured to read out an analog pixel signal from the first or the second unit pixel into the first or the second vertical signal line; and
a signal processing unit configured to convert, into a digital value, the analog pixel signal that is read out into the first and the second vertical signal lines by the read-out circuit.

(20)

An electronic apparatus comprising:
a solid-state imaging device, wherein
the solid-state imaging device comprises:
a first vertical signal line and a second vertical signal line;
a current mirror circuit connected to the first and the second vertical signal lines;
a first unit pixel connected to the first vertical signal line;
a second unit pixel connected to the second vertical signal line;
a current supply line connected to the first and the second unit pixels; and
a constant current circuit connected to the current supply line, each of the first and the second unit pixels comprises:
a photoelectric conversion element configured to photoelectrically convert incident light;
a transfer transistor configured to transfer an electric charge generated in the photoelectric conversion element;
first and second charge accumulation units configured to accumulate the electric charge transferred by the transfer transistor;
a switching transistor configured to control accumulation of the electric charge by the second charge accumulation unit; and
an amplification transistor configured to cause a voltage corresponding to electric charges accumulated in the first charge accumulation unit, or the first and the second charge accumulation units, to appear in the first or the second vertical signal line,
a drain of the amplification transistor of the first unit pixel is connected to the first vertical signal line,
a drain of the amplification transistor of the second unit pixel is connected to the second vertical signal line, and
a source of the amplification transistor of the first unit pixel and a source of the amplification transistor of the second unit pixel are connected to the current supply line.

REFERENCE SIGNS LIST 1, 1A, 1B CMOS IMAGE SENSOR
10 PIXEL ARRAY UNIT
11, 11a to 11f UNIT PIXEL
11A SIGNAL PIXEL
11B, 11C REFERENCE PIXEL
12 SYSTEM CONTROL UNIT
13 VERTICAL DRIVING UNIT
14 COLUMN READ-OUT CIRCUIT UNIT
15 COLUMN SIGNAL PROCESSING UNIT
16 HORIZONTAL DRIVING UNIT
17 SIGNAL PROCESSING UNIT
20 ADC
101 ON-CHIP LENS
102 COLOR FILTER
110 WIRING LAYER
111 WIRING
112 INSULATING FILM
120, 200, 220 SEMICONDUCTOR SUBSTRATE
130, 210 SUPPORT SUBSTRATE
141 CURRENT MIRROR CIRCUIT
142 TAIL CURRENT SOURCE UNIT
201 PERIPHERAL CIRCUIT
300 FIRST SEMICONDUCTOR SUBSTRATE
310 SECOND SEMICONDUCTOR SUBSTRATE
AP LIGHT RECEIVING UNIT OPENING AREA
AMP, $AMP_0$, $AMP_1$, $AMP_c$, $AMP_i$, $AMP_{i+1}$ AMPLIFICATION TRANSISTOR
FD FLOATING DIFFUSION
FD1, $FD1_0$, $FD1_1$, $FD1_c$, $FD1_i$, $FD1_{i+1}$ FIRST FLOATING DIFFUSION
FD2, $FD2_0$, $FD2_1$, $FD2_c$, $FD2_i$, $FD2_{i+1}$ SECOND FLOATING DIFFUSION
FDG, $FDG_0$, $FDG_1$, $FDG_c$, $FDG_i$, $FDG_{i+1}$ SWITCHING TRANSISTOR
LD PIXEL DRIVING LINE
LV VERTICAL PIXEL WIRING
Ltrg TRANSFER TRANSISTOR DRIVING LINE
Lrst RESET TRANSISTOR DRIVING LINE
Lfdg SWITCHING TRANSISTOR DRIVING LINE Lsel SELECTION TRANSISTOR DRIVING LINE
Mp0, Mp1 PMOS TRANSISTOR
PD, $PD_0$, $PD_1$, $PD_c$, $PD_i$, $PD_{i+1}$, $PD_m$, $PD_{m+1}$ PHOTODIODE
RST, $RST_0$, $RST_1$, $RST_c$, $RST_i$, $RST_{i+1}$ RESET TRANSISTOR
SEL, $SEL_0$, $SEL_1$, $SEL_c$, $SEL_i$, $SEL_{i+1}$ SELECTION TRANSISTOR
SWRDS0, SWRDS1, SWRDD0, SWRDD1, SWVSS0, SWVSS1, SWVSD0, SWVSD1, SWCOMD, SWCOMS, SW0 to SW5 SWITCH
TRG, $TRG_0$, $TRG_1$, $TRG_c$, $TRG_i$, $TRG_{i+1}$, $TRG_m$, $TRG_{m+1}$ TRANSFER TRANSISTOR
VCOM VERTICAL CURRENT SUPPLY LINE
VRD, $VRD_0$, $VRD_1$ VERTICAL RESET INPUT LINE
VSL, $VSL_0$, $VSL_1$ VERTICAL SIGNAL LINE

The invention claimed is:

1. A solid-state imaging device comprising:
a first vertical signal line and a second vertical signal line;
a current mirror circuit connected to the first and the second vertical signal lines;
a first unit pixel connected to the first vertical signal line;
a second unit pixel connected to the second vertical signal line;
a current supply line connected to the first and the second unit pixels; and
a constant current circuit connected to the current supply line, wherein
each of the first and the second unit pixels comprises:
a photoelectric conversion element configured to photoelectrically convert incident light;
a transfer transistor configured to transfer an electric charge generated in the photoelectric conversion element;
first and second charge accumulation units configured to accumulate the electric charge transferred by the transfer transistor;
a switching transistor configured to control accumulation of the electric charge by the second charge accumulation unit; and
an amplification transistor configured to cause a voltage corresponding to electric charges accumulated in the first charge accumulation unit, or the first and the second charge accumulation units, so appear in the first or the second vertical signal line,
a drain of the amplification transistor of the first unit pixel is connected to the first vertical signal line,
a drain of the amplification transistor of the second unit pixel is connected to the second vertical signal line, and
a source of the amplification transistor of the first unit pixel and a source of the amplification transistor of the second unit pixel are connected to the current supply line.

2. The solid-state imaging device according to claim 1, further comprising:
a reset transistor configured to discharge the electric charges accumulated in the first and the second charge accumulation units.

3. The solid-state imaging device according to claim 1, wherein each of the first and the second unit pixels further comprises a selection transistor connected between the drain of the amplification transistor and the first or the second vertical signal line.

4. The solid-state imaging device according to claim 1, wherein
the first charge accumulation unit includes a first capacitance component disposed at a first node connecting a drain of the transfer transistor with a gate of the amplification transistor, and a second capacitance component between the first node and a second node on the drain side of the amplification transistor, and
the second charge accumulation unit includes a third capacitance component disposed at a third node on the drain side of the transfer transistor, and a fourth capacitance component between the third node and a fourth node on the drain side of the amplification transistor.

5. The solid-state imaging device according to claim 4, wherein at least one of the first to the fourth capacitance components is a capacitance component that is added by using a capacitive element or a metal layer.

6. The solid-state imaging device according to claim 1, wherein
a source of the transfer transistor is connected to the photoelectric conversion element,
a drain of the transfer transistor is connected to a gate of the amplification transistor and a source of the switching transistor,
the first charge accumulation unit is disposed at a node connecting the drain of the transfer transistor with the gate of the amplification transistor, and
the second charge accumulation unit is disposed at a node connecting the drain of the transfer transistor with the source of the switching transistor.

7. The solid-state imaging device according to claim 1, wherein
each of the first and the second unit pixels further comprises:
wiring configured to connect a drain of the transfer transistor with the first or the second vertical signal line; and
a capacitive element disposed on the wiring,
a source of the transfer transistor is connected to the photoelectric conversion element,
the drain of the transfer transistor is connected to a gate of the amplification transistor, and
the switching transistor is disposed on the wiring.

8. The solid-state imaging device according to claim 7, wherein the capacitive element is disposed between the drain of the transfer transistor and a source of the switching transistor.

9. The solid-state imaging device according to claim 7, wherein the capacitive element is disposed between a drain of the switching transistor and the first or the second vertical signal line.

10. The solid-state imaging device according to claim 1, wherein
a source of the transfer transistor is connected to the photoelectric conversion element,
a drain of the transfer transistor is connected to a gate of the amplification transistor and a drain of the switching transistor,
the first charge accumulation unit is disposed at a node connecting the drain of the transfer transistor with the gate of the amplification transistor, and
the second charge accumulation unit is disposed between a source of the switching transistor and grounding.

11. The solid-state imaging device according to claim 1, wherein a gate of the amplification transistor of each of the first and the second unit pixels is connected to a drain of a transfer transistor that is disposed in another unit pixel.

12. The solid-state imaging device according to claim 1, comprising:
a first switch configured to switch connection between the first vertical signal line and the current mirror circuit;

a second switch configured to switch connection between the second vertical signal line and the current mirror circuit;

a third switch configured to switch connection between the current supply line and the constant current circuit;

a fourth switch configured to switch connection between the first vertical signal line and the constant current circuit;

a fifth switch configured to switch connection between the second vertical signal line and the constant current circuit; and a sixth switch configured to switch connection between the current supply line and a power supply voltage.

13. The solid-state imaging device according to claim 12, wherein
the first to the third switches are caused to be in an ON state during a period of a differential read-out mode, and caused to be in an OFF state during a period of a source follower read-out mode, and
the fourth to the sixth switches are caused to be in an OFF state during the period of the differential read-out mode, and caused to be in an ON state during the period of the source follower read-out mode.

14. The solid-state imaging device according to claim 1, comprising:
a first switch configured to switch connection between the first vertical signal line and the current mirror circuit;
a second switch configured to switch connection between the current supply line and the constant current circuit;
a third switch configured to switch connection between the first vertical signal line and the constant current circuit; and
a fourth switch configured to switch connection between the current supply line and a power supply voltage.

15. The solid-state imaging device according to claim 14, wherein
the first and the second switches are caused to be in an ON state during a period of a differential read-out mode, and caused to be in an OFF state during a period of a source follower read-out mode, and
the third and the fourth switches are caused to be in an OFF state during the period of the differential read-out mode, and caused to be in an ON state during the period of the source follower read-out mode.

16. The solid-state imaging device according to claim 1, comprising:
a plurality of unit pixels including the first and the second unit pixels, wherein
the unit pixels are two-dimensionally arranged in a matrix, and
the first unit pixel and the second unit pixel are arranged in a same column.

17. The solid-state imaging device according to claim 16, wherein the second unit pixel is adjacent to the first unit pixel in the same column.

18. The solid-state imaging device according to claim 16, wherein the second unit pixel is a fixed unit pixel in the same column.

19. The solid-state imaging device according to claim 1, further comprising:
a read-out circuit that is connected to the first and the second vertical signal lines, and configured to read out an analog pixel signal from the first or the second unit pixel into the first or the second vertical signal line; and
a signal processing unit configured to convert, into a digital value, the analog pixel signal that is read out into the first and the second vertical signal lines by the read-out circuit.

20. An electronic apparatus comprising:
a solid-state imaging device, wherein
the solid-state imaging device comprises:
a first vertical signal line and a second vertical signal line;
a current mirror circuit connected to the first and the second vertical signal lines;
a first unit pixel connected to the first vertical signal line;
a second unit pixel connected to the second vertical signal line;
a current supply line connected to the first and the second unit pixels; and
a constant current circuit connected to the current supply line,
each of the first and the second unit pixels comprises:
a photoelectric conversion element configured to photoelectrically convert incident light;
a transfer transistor configured to transfer an electric charge generated in the photoelectric conversion element;
first and second charge accumulation units configured to accumulate the electric charge transferred by the transfer transistor;
a switching transistor configured to control accumulation of the electric charge by the second charge accumulation unit; and
an amplification transistor configured to cause a voltage corresponding to electric charges accumulated in the first charge accumulation unit, or the first and the second charge accumulation units, to appear in the first or the second vertical signal line,
a drain of the amplification transistor of the first unit pixel is connected to the first vertical signal line,
a drain of the amplification transistor of the second unit pixel is connected to the second vertical signal line, and
a source of the amplification transistor of the first unit pixel and a source of the amplification transistor of the second unit pixel are connected to the current supply line.

* * * * *